(12) United States Patent
Yu et al.

(10) Patent No.: US 9,348,008 B2
(45) Date of Patent: May 24, 2016

(54) NONINVASIVE CHARACTERIZATION OF MECHANICAL PROPERTIES OF MATERIALS AND TISSUES USING MAGNETIC RESONANCE TECHNIQUES

(75) Inventors: Yihua Bruce Yu, Elicott City, MD (US); Yue Feng, Cockeysville, MD (US); Marc Taraban, Gaithersburg, MD (US)

(73) Assignees: University of Maryland, Baltimore, Baltimore, MD (US); University of Maryland, College Park, College Park, MD (US)

( * ) Notice: Subject to any disclaimer, the term of this patent is extended or adjusted under 35 U.S.C. 154(b) by 781 days.

(21) Appl. No.: 13/602,241

(22) Filed: Sep. 3, 2012

(65) Prior Publication Data
US 2013/0057279 A1 Mar. 7, 2013

Related U.S. Application Data

(60) Provisional application No. 61/530,125, filed on Sep. 1, 2011.

(51) Int. Cl.
*G01R 33/50* (2006.01)
*G01R 33/563* (2006.01)

(52) U.S. Cl.
CPC .......... *G01R 33/56358* (2013.01); *G01R 33/50* (2013.01)

(58) Field of Classification Search
USPC ............. 324/300–322; 600/407–438; 702/41; 382/128–131
See application file for complete search history.

(56) References Cited

U.S. PATENT DOCUMENTS

| 5,592,085 | A | * | 1/1997 | Ehman | A61B 5/055 324/307 |
| 5,977,770 | A | * | 11/1999 | Ehman | A61B 5/055 324/318 |
| 8,394,026 | B2 | * | 3/2013 | Eskandari et al. | 600/438 |
| 2010/0160778 | A1 | * | 6/2010 | Eskandari et al. | 600/438 |
| 2013/0024136 | A1 | * | 1/2013 | Gallippi et al. | 702/41 |
| 2013/0057279 | A1 | * | 3/2013 | Yu et al. | 324/309 |

OTHER PUBLICATIONS

N. Hill, "Mutual Viscosity and Diffusion in Liquid Mixtures", "Proceedings of the Physical Society, Section B", 1955, pp. 209-212, vol. 68, No. 4, Publisher: IOP Publishing, Published in: http://http://iopscience.iop.org/0370-1301/68/4/302.
S. Meiboom and D. Gill, "Modified Spin-Echo Method for Measuring Nuclear Relaxation Times", "Review of Scientific Instruments", 1958, pp. 688-691, vol. 29, No. 4, Publisher: American Institute of Physics, Published in: http://rsi.aip.org/resource/1/rsinak/v29/i8/p688_s1?isAuthorized=no.
R. L. Vold et al., "Measurement of Spin Relaxation in Complex Systems", "Journal of Chemical Physics", 1968, pp. 3831-3832, vol. 48, No. 8, Publisher: American Institute of Physics, Published in: http://jcp.aip.org/resource/1/jcpsa6/v138/i3.
Wu, Donghui et al., "An Improved Diffusion-Ordered Spectroscopy Experiment Incorporating Bipolar-Gradient Pulses," J. Magnetic Resonance Ser. A 115 (1995): 260-264; Academic Press http://www.sciencedirect.com/science/article/pii/S106418588571176X.

* cited by examiner

*Primary Examiner* — Dixomara Vargas
*Assistant Examiner* — Tiffany Fetzner
(74) *Attorney, Agent, or Firm* — Beusse Wolter Sanks & Maire, PLLC; Eugene J. Molinelli

(57) ABSTRACT

Techniques include determining, non-invasively and without applying deformational stress, a nuclear magnetic resonance relaxation rate at a volume inside a subject. The method also includes determining a mechanical property of material at the volume inside the subject based on the nuclear magnetic resonance relaxation rate.

20 Claims, 17 Drawing Sheets

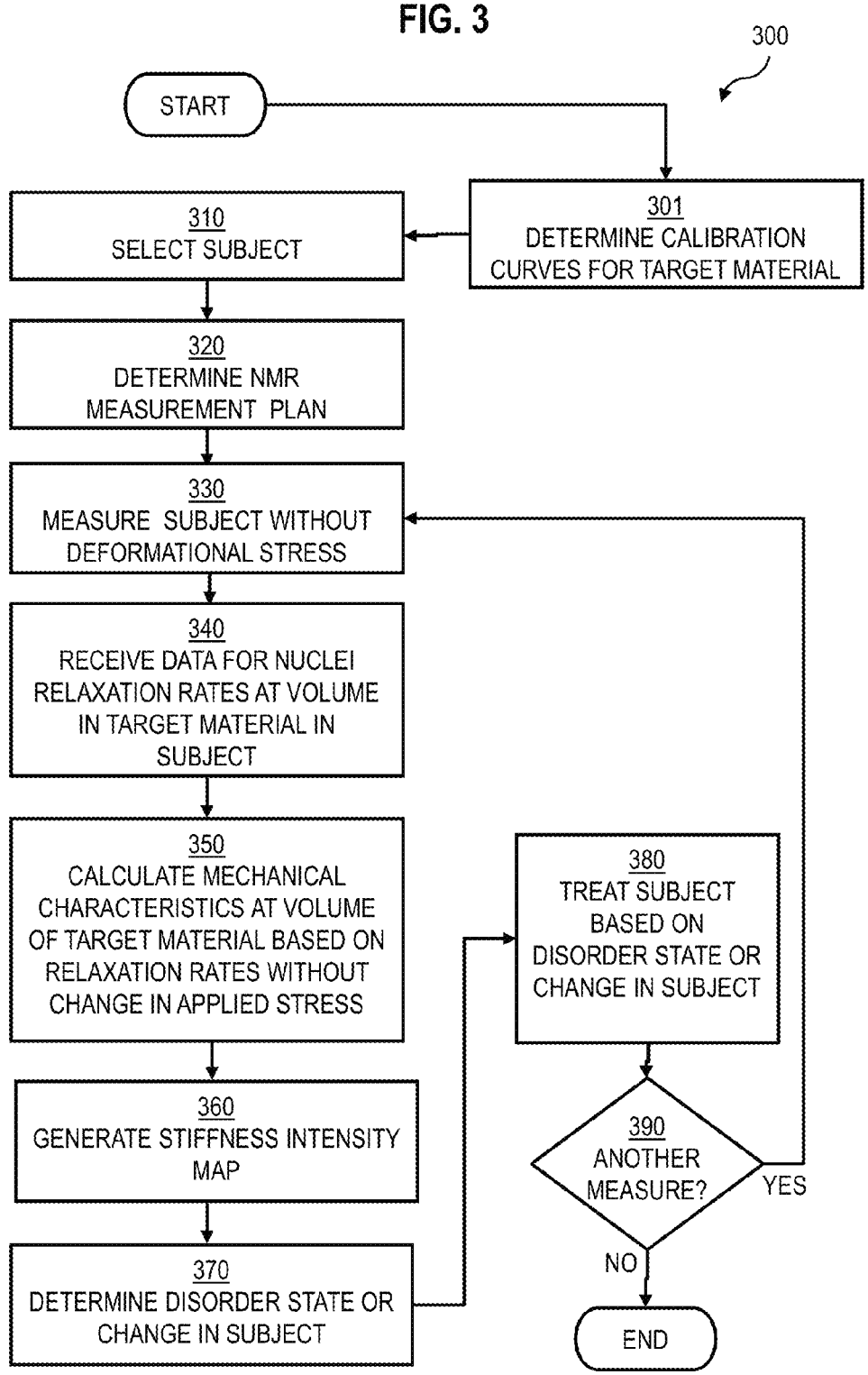

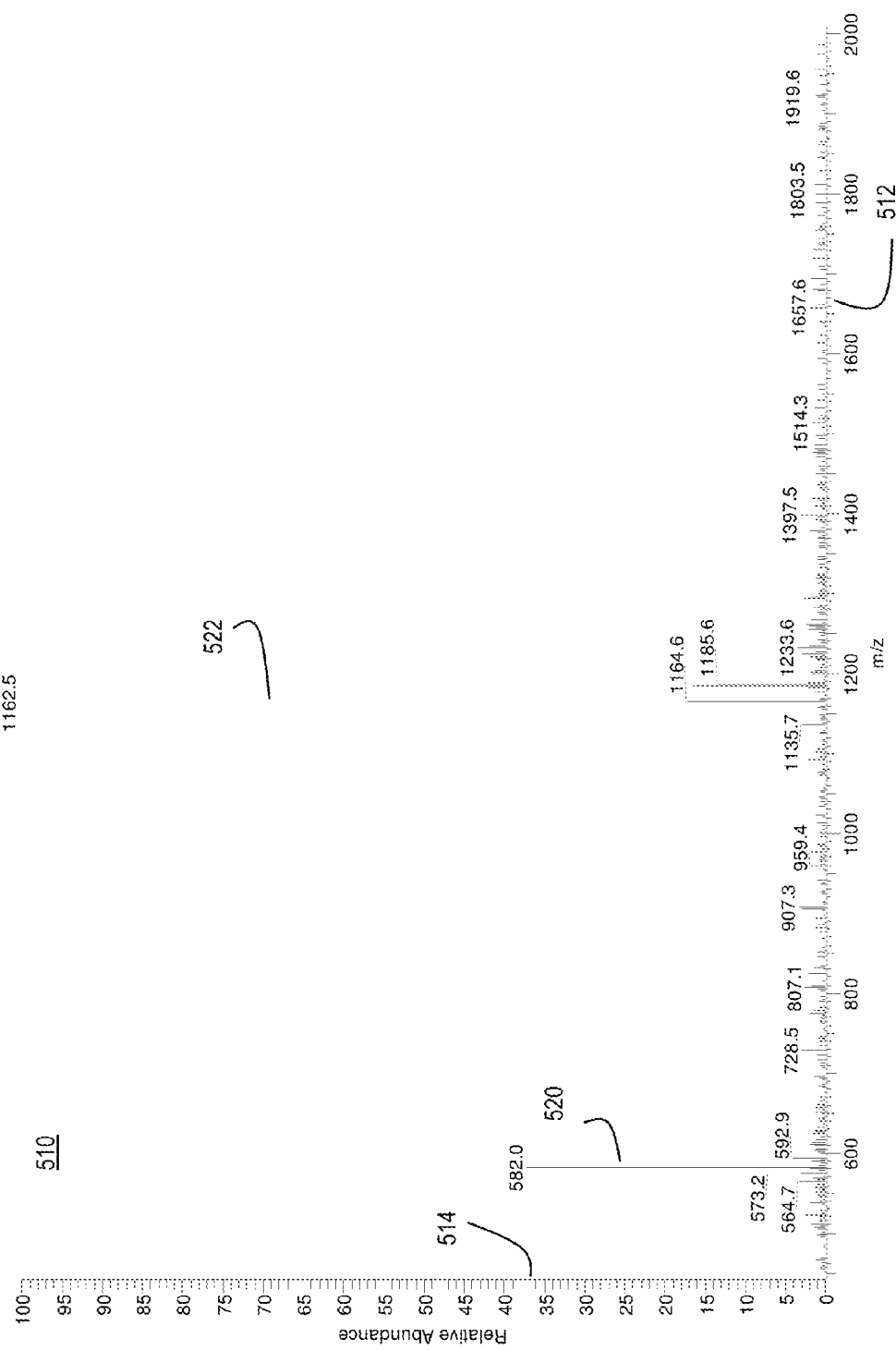

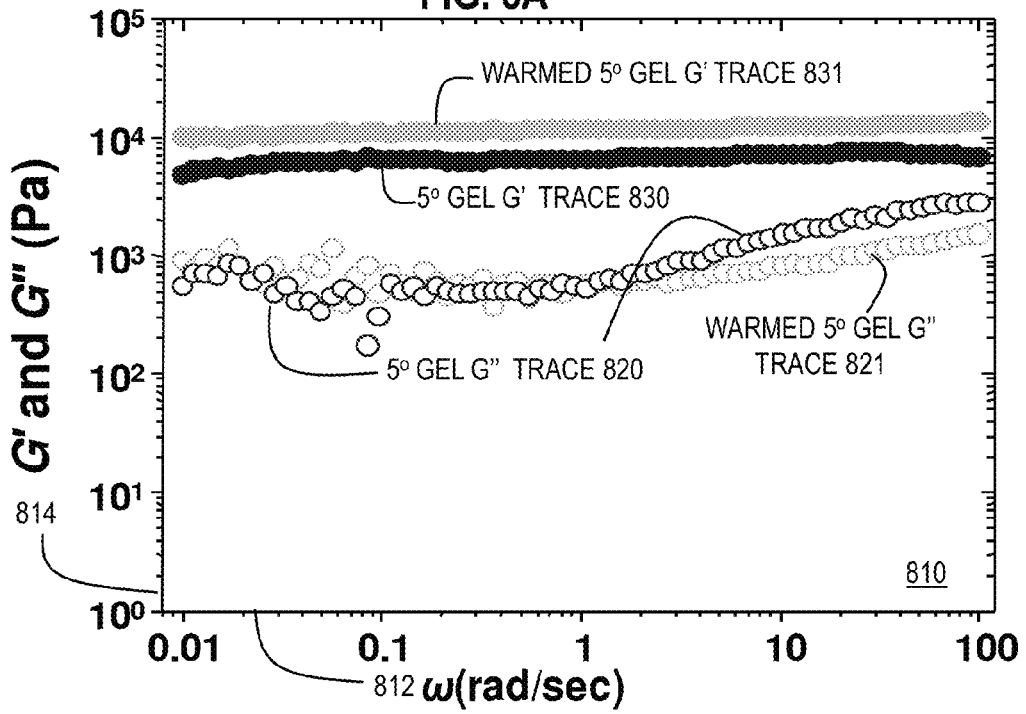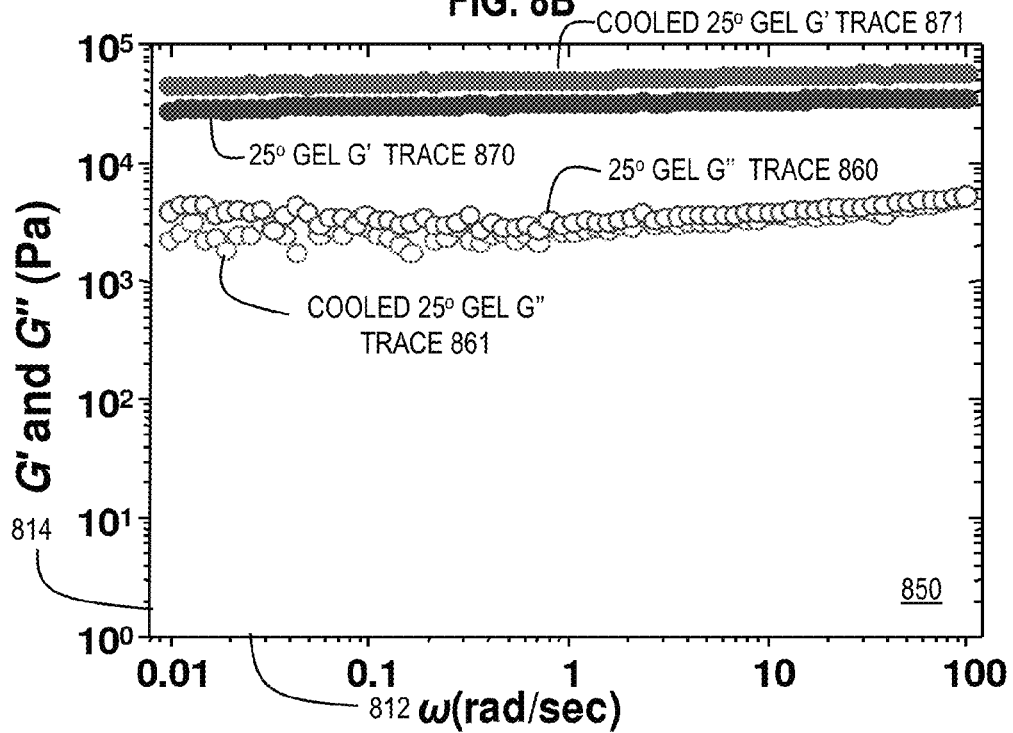

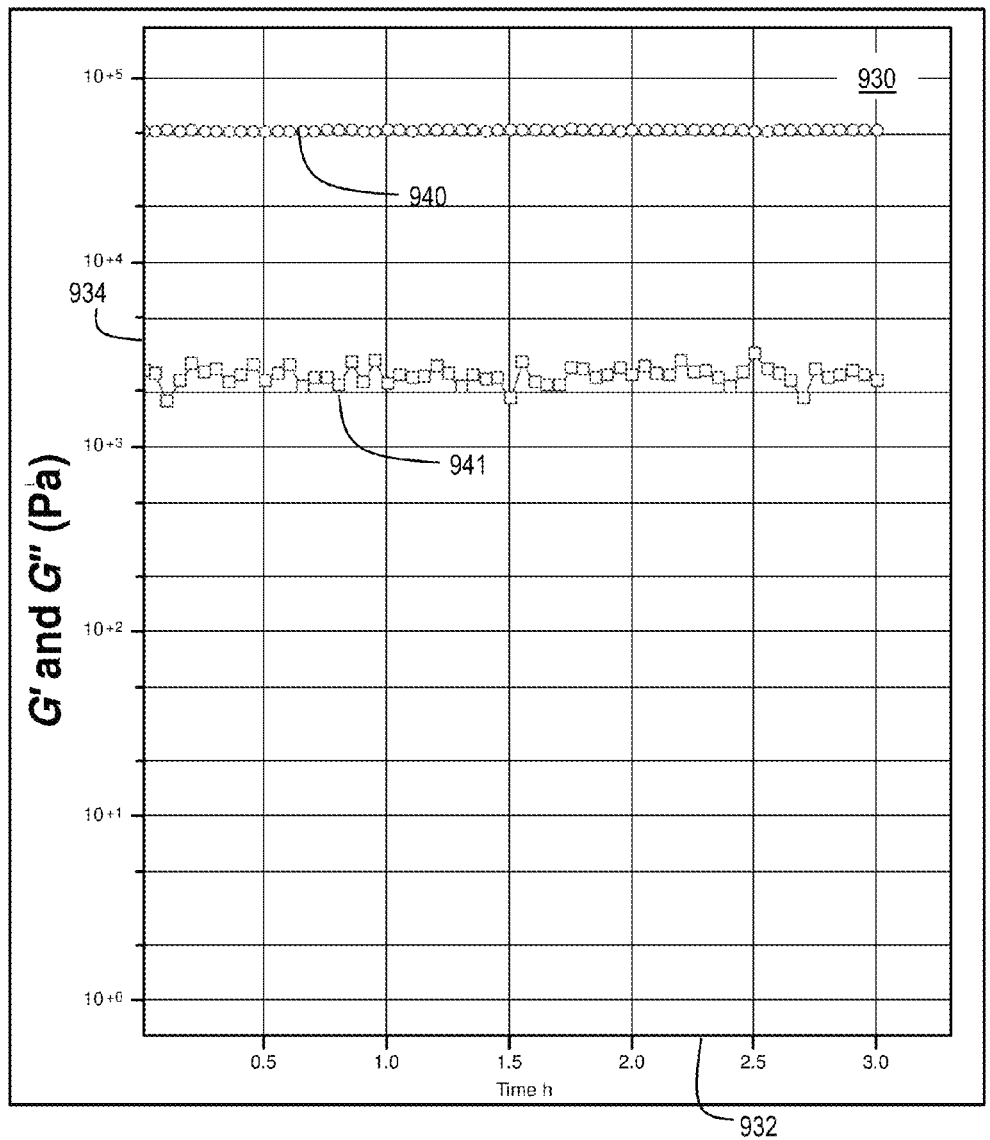

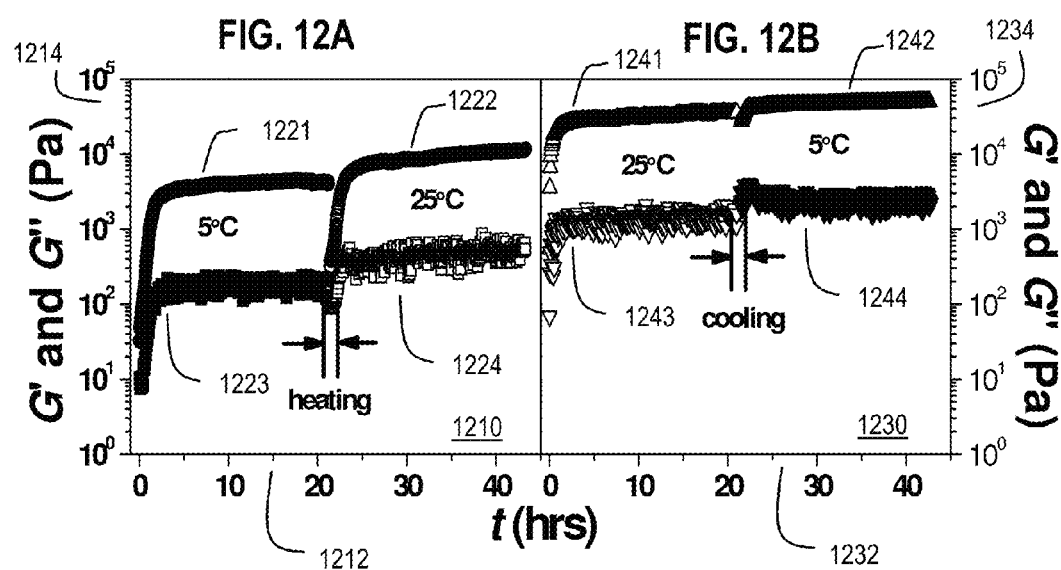

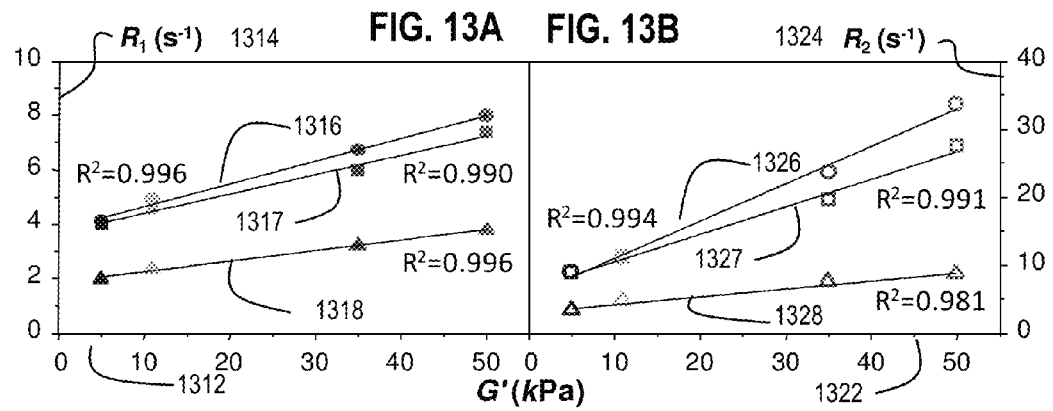
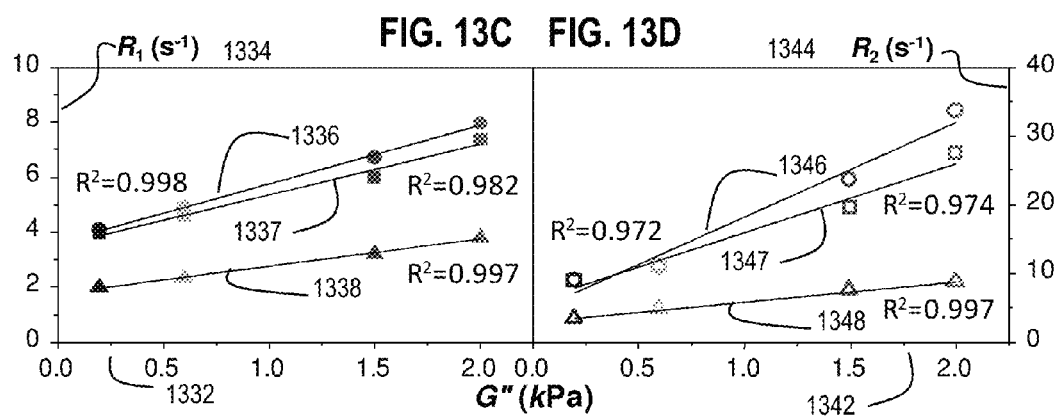
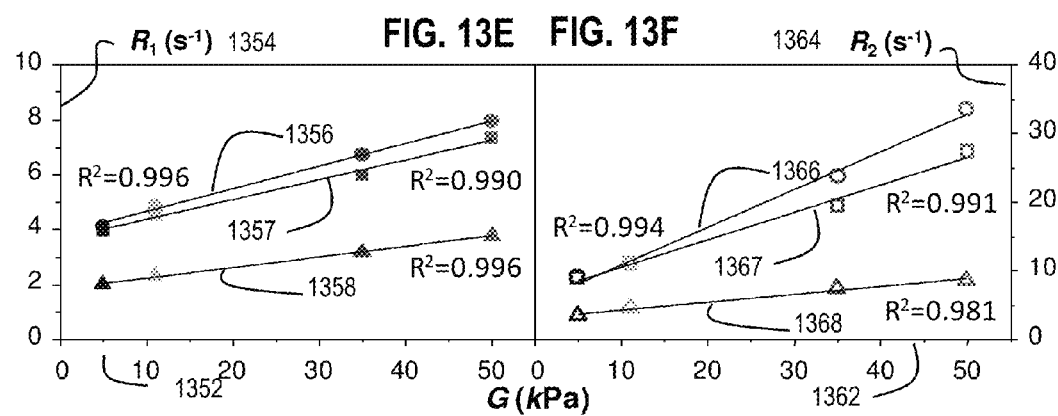

SEQUENCE LISTING

```
<160> NUMBER OF SEQ ID NOS: 4

<210> SEQ ID NO 1
<211> LENGTH: 10
<212> TYPE: PRT
<213> ORGANISM: Artificial Sequence
<220> FEATURE:
<223> OTHER INFORMATION: Synthetic peptide
<220> FEATURE:
<221> NAME/KEY: MOD_RES
<222> LOCATION: (1)..(1)
<223> OTHER INFORMATION: FORMYLATION
<220> FEATURE:
<221> NAME/KEY: MOD_RES
<222> LOCATION: (10)..(10)
<223> OTHER INFORMATION: AMIDATION

<400> SEQUENCE: 1

Glu Phe Glu Ala Glu Ala Glu Ala Glu Trp
1               5                   10

<210> SEQ ID NO 2
<211> LENGTH: 10
<212> TYPE: PRT
<213> ORGANISM: Artificial Sequence
<220> FEATURE:
<223> OTHER INFORMATION: Synthetic peptide
<220> FEATURE:
<221> NAME/KEY: MOD_RES
<222> LOCATION: (1)..(1)
<223> OTHER INFORMATION: FORMYLATION
<220> FEATURE:
<221> NAME/KEY: misc_feature
```

```
<222> LOCATION: (1)..(10)
<223> OTHER INFORMATION: Every Xaa is ornithine
<220> FEATURE:
<221> NAME/KEY: MOD_RES
<222> LOCATION: (10)..(10)
<223> OTHER INFORMATION: AMIDATION

<400> SEQUENCE: 2

Xaa Phe Xaa Ala Xaa Ala Xaa Ala Xaa Trp
1               5                   10

<210> SEQ ID NO 3
<211> LENGTH: 11
<212> TYPE: PRT
<213> ORGANISM: Artificial Sequence
<220> FEATURE:
<223> OTHER INFORMATION: Synthetic peptide
<220> FEATURE:
<221> NAME/KEY: MOD_RES
<222> LOCATION: (1)..(1)
<223> OTHER INFORMATION: ACETYLATION
<220> FEATURE:
<221> NAME/KEY: MOD_RES
<222> LOCATION: (11)..(11)
<223> OTHER INFORMATION: AMIDATION

<400> SEQUENCE: 3

Lys Trp Lys Ala Lys Ala Lys Ala Lys Trp Lys
1               5                   10

<210> SEQ ID NO 4
<211> LENGTH: 11
<212> TYPE: PRT
<213> ORGANISM: Artificial Sequence
<220> FEATURE:
<223> OTHER INFORMATION: Synthetic peptide
<220> FEATURE:
<221> NAME/KEY: MOD_RES
<222> LOCATION: (1)..(1)
<223> OTHER INFORMATION: ACETYLATION
<220> FEATURE:
<221> NAME/KEY: MOD_RES
<222> LOCATION: (10)..(10)
<223> OTHER INFORMATION: AMIDATION

<400> SEQUENCE: 4

Glu Trp Glu Ala Glu Ala Glu Ala Glu Trp Glu
1               5                   10
```

NONINVASIVE CHARACTERIZATION OF MECHANICAL PROPERTIES OF MATERIALS AND TISSUES USING MAGNETIC RESONANCE TECHNIQUES

CROSS-REFERENCE TO RELATED APPLICATIONS

This application claims benefit of Provisional Appln. 61/530,125, filed Sep. 1, 2011, the entire contents of which are hereby incorporated by reference as if fully set forth herein, under 35 U.S.C. §119(e).

STATEMENT OF GOVERNMENTAL INTEREST

This invention was made with Government support under Grant Number EB004416 awarded by the National Institutes of Health. The Government has certain rights in the invention.

BACKGROUND OF THE INVENTION

Many diseases alter the mechanical properties of a tissue. Accordingly, the mechanical properties can serve as biomarkers for disease, diagnosis and tumor assessment. While some larger diseased tissues or abnormalities near the surface of a patient can be detected by palpitation, many are located deep within the patient or too small to identify. Some indications include liver fibrosis or other growths inside the thoracic cavity. A non-invasive means for detecting mechanical properties of a patient would provide physicians with a reliable tool to diagnose and monitor diseased tissue.

Viscoelastic materials (also called complex fluids) exhibit the elastic properties of solids as well as the viscous flow characteristics of fluids in response to shearing stresses. The study of the mechanical properties of viscoelastic materials is known as 'rheology.' Rheo-NMR uses nuclear magnetic resonance (NMR) to measure the fluid flow response to deformational stresses.

Magnetic Resonance Elastography (MRE) is one non-invasive method for detecting mechanical properties in a tissue in the field of Rheo-NMR. MRE mechanically excites the tissue by introducing shear waves through ultrasound. Nuclear Magnetic Resonance Images (MRI) of the propagation of the shear waves are taken. Specific mathematical algorithms are used to interpret the images and generate quantitative images depicting tissue stiffness. The mechanical excitation drastically complicates the imaging process in terms of hardware design, imaging implementation and data analysis. MRE cannot be performed using a conventional medical MRI machine.

SUMMARY OF THE INVENTION

Applicants have determined that there is a need for elasticity imaging methods and systems that overcome the limitations of the methods described above. Techniques are provided for the non-invasive measurement of mechanical properties of materials and tissues. Embodiments described herein utilize conventional magnetic resonance imaging and nuclear magnetic resonance techniques to detect and quantify the mechanical characteristics of a target without the need for externally applied stress, such as deformation devices or ultrasound sources.

In one set of embodiments, a method includes determining, non-invasively and without applying deformational stress, a nuclear magnetic resonance relaxation rate at a volume inside a subject. The method also includes determining a mechanical property of material at the volume inside the subject based on the nuclear magnetic resonance relaxation rate.

In other sets of embodiments, an apparatus or non-transitory computer-readable medium is configured to cause an apparatus to perform one or more steps of one or more of the above methods.

Among other applications, embodiments may be used to identify diseased tissue, differentiate diseased tissue from healthy tissue, quantify the level of the disease, and monitor the progression of disease over time. Embodiments may be employed before treatment begins, concurrently during treatment, or post-treatment. Embodiments may also be used for the quantification of mechanical characteristics of materials for non-medical purposes.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 is a flow diagram that illustrates at a high level an example method for quantifying the mechanical properties of material in a subject, according to an embodiment;

FIG. 5 is a graph that illustrates example mass spectrometry peptide purity validation results for a first peptide component of the hydrogel, according to an embodiment;

FIG. 8A and FIG. 8B are graphs that illustrate example frequency-sweep dynamic rheometry measurements of the hydrogels, according to an embodiment;

FIG. 9A and FIG. 9B are graphs that illustrates example time-sweep measurements of viscoelastic properties of decapeptide hydrogels performed after frequency-sweeps confirming the stability of the gels, according to an embodiment;

FIG. 12A and FIG. 12B are graphs that illustrate example mechanical properties during the gelation process monitored by dynamic rheometry, according to an embodiment;

FIG. 13A through FIG. 13F are graphs that illustrate example dependence of NMR relaxation rates on mechanical properties of hydrogels, according to an embodiment;

DETAILED DESCRIPTION

Figure 1:
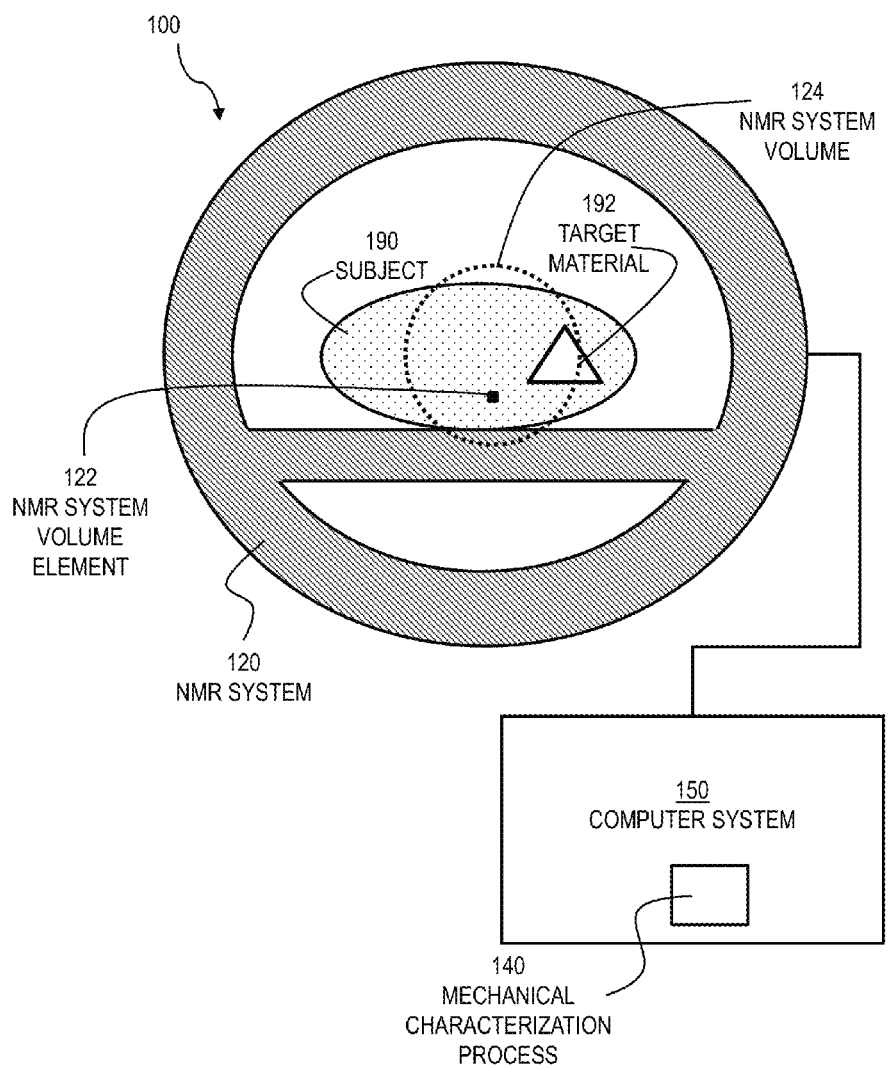
FIG. 1 is a block diagram that illustrates an example system for determining the mechanical characteristics in a subject, according to an embodiment.

A method and apparatus are described for the non-invasive, stress-free characterization of mechanical properties of materials and tissues. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Some embodiments of the invention are described below in the context of certain gelatinous materials external to a living body. However, the invention is not limited to this context. In other embodiments one or more mechanical properties of tissues, or portions thereof, internal to a living subject are determined non-invasively and without changing deformational stresses applied to the living subject. In yet other embodiments, the mechanical properties of materials internal to an inanimate subject are determined non-invasively and without changing deformational stresses applied to the inanimate subject.

In the following, various references are cited, the full citations for which appear in a references section at the end of this description. The entire contents of each of these cited references are hereby incorporated by reference as if fully set forth herein, except for terminology that is inconsistent with that used herein.

1. OVERVIEW

Nuclear magnetic resonance (NMR) studies magnetic nuclei by aligning them with an applied constant magnetic field ($B_0$) and perturbing this alignment using an alternating magnetic field ($B_1$), orthogonal to the constant magnetic field. The resulting response to the perturbing magnetic field is the phenomenon that is exploited in magnetic resonance spectroscopy (MRS) and magnetic resonance imaging (MRI).

The elementary particles, neutrons and protons, composing an atomic nucleus, have the intrinsic quantum mechanical property of spin. The overall spin of the nucleus is determined by the spin quantum number I. If the number of both the protons and neutrons in a given isotope are even, then I=0. In other cases, however, the overall spin is non-zero. A non-zero spin is associated with a non-zero magnetic moment, $\mu$, as given by Equation 1a.

$$\mu = \gamma I \quad (1a)$$

where the proportionality constant, $\gamma$, is the gyromagnetic ratio. It is this magnetic moment that is exploited in NMR. For example, nuclei that have a spin of one-half, like Hydrogen nuclei ($^1H$), a single proton, have two possible spin states (also referred to as up and down, respectively). The energies of these states are the same. Hence the populations of the two states (i.e. number of atoms in the two states) will be approximately equal at thermal equilibrium. If a nucleus is placed in a magnetic field, however, the interaction between the nuclear magnetic moment and the external magnetic field means the two states no longer have the same energy. The energy difference between the two states is given by Equation 1b.

$$\Delta E = \hbar \gamma B_0 \quad (1b)$$

where $\hbar$ is Planck's reduced constant. Resonant absorption will occur when electromagnetic radiation of the correct frequency to match this energy difference is applied. The energy of photons of electromagnetic radiation is given by Equation 2.

$$E = hf \quad (2)$$

where f is the frequency of the electromagnetic radiation and $h = 2\pi \hbar$. Thus, absorption will occur when the frequency is given by Equation 3.

$$f = \gamma B_0 / (2\pi) \quad (3)$$

The NMR frequency f is shifted by the 'shielding' effect of the surrounding electrons. In general, this electronic shielding reduces the magnetic field at the nucleus (which is what determines the NMR frequency). As a result, the energy gap is reduced, and the frequency required to achieve resonance is also reduced. This shift of the NMR frequency due to the chemical environment is called the chemical shift, and it explains why NMR is a direct probe of chemical structure. The chemical shift in absolute terms is defined by the frequency of the resonance expressed with reference to a standard which is defined to be at 0. The scale is made more manageable by expressing it in parts per million (ppm) of the standard frequency.

Applying a short electromagnetic pulse in the radio frequency (RF) range to a set of nuclear spins simultaneously excites all the NMR transitions. In terms of the net magnetization vector, this corresponds to tilting the magnetization vector away from its equilibrium position (aligned along the external magnetic field, B0). The out-of-equilibrium magnetization vector precesses about the external magnetic field at the NMR frequencies of the various spins. This oscillating magnetization induces a current in a nearby pickup coil acting as a radio frequency (RF) receiver, creating an electrical signal oscillating at a combination of the NMR frequencies. A portion of this time domain signal (intensity vs. time) is known as the free induction decay (FID) and contains the sum of the NMR responses from all the excited spins. In order to obtain the frequency-domain NMR spectrum (intensity vs. frequency) for magnetic resonance spectroscopy (MRS) and MRS imaging (MRSI), this time-domain signal is Fourier transformed to a frequency domain signal. An example NMR spectrum for a volume element in a hydrogel material is describe below with reference to FIG. 2.

A typical NMR measurement does not substantially alter the system under study. The nuclear spins, once promoted to the higher energy level, quickly return to the lower energy level by some route. This process of returning to the pre-experiment condition is called relaxation. The relaxation rate of a peak represents the time constant that indicates the rate of exponential decay of each peak over time. The relaxation rate is the reciprocal of the time (called relaxation time) it takes for a peak to reach 1/e of its initial height, where e is the base of the natural logarithm. The relaxation rate for a component of the magnetic field parallel to the fixed field $B_0$ (the z component) is called the spin-lattice relaxation rate, R1. The relaxation rate for a transverse component of the magnetic field is called the spin-spin relaxation rate, R2. The corresponding relaxation times are $T_1$ and $T_2$, respectively.

If the relaxation is quick, the peak areas reflect the number of contributing nuclei. If the relaxation is slow or the signal strength great enough and persistent enough, nuclei are promoted to the higher energy spin state faster than they can leave it. Eventually the population excess of the lower energy level will be depleted and the two populations will become the same. This is called saturation. As the system begins to saturate, the NMR signal will diminish in intensity and at full saturation will disappear.

The relaxation of nuclear spins is entirely due to interactions with the surroundings (e.g., see Cavanagh, et al., 1996). Applicants have determined that nuclear spin relaxation rates have a significant, repeatable dependency on the mechanical properties of the surrounding media. Such a relationship is valuable because it allows noninvasive evaluation of mechanical properties using magnetic resonance techniques, such as NMR and MRI. Specifically, significant relationships are determined between nuclear spin relaxation rates and elastic modulus in various materials with elastic modulus properties similar to those of human tissue.

The mechanical properties of viscoelastic materials, such as organic tissue, are characterized by the elastic modulus G' and viscous modulus G'', which together gives the shear modulus G according to Equation 4 (e.g., see Morrison, 2001).

$$G = (G'^2 + G''^2)^{1/2} \quad (4).$$

Surprisingly, significant, repeatable relationships were observed when relaxation rates of diffusants (unincorporated molecules) in hydrogels are plotted against the shear modulus of the hydrogel. Hydrogels are viscoelastic materials with many natural (e.g., collagen) and manmade (e.g., contact lenses) examples. Hydrogels have mechanical properties similar to various mammalian tissues. Both the spin-lattice and spin-spin relaxation rates, R1 and R2, respectively, display a significant dependency on G. This dependency is also valid for G' and G''. The spin-spin relaxation rate R2 is several times more sensitive to mechanical properties, as is shown below, and is recommended in some embodiments. This result is surprising not only because of its simplicity, but also because R1 and R2 of the diffusants are measured without applying any force (e.g., stress) to the material.

Such relationships are useful in the detection or monitoring of disease. Table 1 shows the dependence of the elastic modulus G' (in kiloPascals, kPa, 1 kPa=$10^3$ pascals, 1 pascal, Pa, is one newton per square meter) on healthy and diseased human tissues. Such variations are anticipated to lead to corresponding observable changes in relaxation rates.

TABLE 1

Variation of elastic modulus G' with pathology of human tissue.

| Human Tissue | Healthy, kPa | Pathology, kPa (condition) | Reference |
|---|---|---|---|
| Liver | 0.64 | 1.64 (fibrosis) | Yeh, W. -C. et al, *2001 IEEE Ultrasonic Symposium*, 1234 |
| Breast | 28 | 106 (ductal carcinoma) | Krouskop, T. A. et al. *Ultrason. Imag.* 1998, 20, 260-274 |
| Prostate | 60 | 96 (cancer) | Krouskop, T. A. et al. *Ultrason. Imag.* 1998, 20, 260-274 |
| Muscle | 1.83 | N/A | Chen, E. J. et al. *IEEE Trans. Ultrason., Ferroelect., Freq. Contr.* 1996, 43, 191-194 |
| Vocal fold | 1.2 | N/A | Goodyer, E. et al. *Eur. Arch. Otorhinolaryngol.* 2007, 264, 45-50 |
| Kidney | 10 | N/A | Wells, P. N. T. et al. *J. Royal Soc. Interface* 2011, doi: 10.1098/rsif.2011.0054 |
| Skin (dermis) | 1980 | N/A | Genisson, J. -L. et al. *IEEE Trans.Ultrason., Ferroelect., Freq. Contr.* 2004, 51, 980-989 |
| Skin (hypodermis) | 5.46 | N/A | Genisson, J.-L. et al. *IEEE Trans.Ultrason., Ferroelect., Freq. Contr.* 2004, 51, 980-989 |
| Lung | 0.4 | N/A | Lai-Fook, S. J. et al. *J. Appl. Physiol.* 2000, 89, 163-168, |
| Ligament | 1720 | N/A | Weiss, J.A. *J. Biomech.* 2002, 35, 943-950 |
| Tendon | 2000000 | N/A | Svensson, R.B. et al. *J. Appl. Physiol.* 2012, 112, 419-426 |
| Brain | 3.3 | 2.6 (multiple sclerosis) | Streitberger, K. -J. et al. *PLoS One* 2012, 7, e29888 |

2. STRUCTURAL OVERVIEW

FIG. 1 is a block diagram that illustrates an example system 100 for determining the mechanical properties in a subject, according to an embodiment. System 100 includes nuclear magnetic resonance (NMR) system 120 and computer system 150, and operates on a subject 190, such as a living patient, e.g., an animal or human. Although depicted for purposes of illustration, subject 190 is not part of system 100. Subject 190 may include any non-living objects or any inanimate hydrophilic tissue specimens of interest. In the illustrated embodiment, mechanical properties of a target material 192 in subject 190 are of interest.

NMR system 120 may be any machine capable of performing conventional nuclear magnetic resonance. NMR system 120 determines the nuclear magnetic resonance for each NMR system volume element 122 in an NMR system volume 124. In some embodiments of non-imaging nuclear magnetic resonance measurements, the system volume 124 and the system volume element are almost the same scale. In imaging systems, such as a MRI system, the system volume element 122 is several orders of magnitude smaller than the system volume 124. Nuclear magnetic resonance spectroscopic imaging (MRSI) systems use a MSRI system volume element that is about an order of magnitude larger than the volume element in an MRI system.

Figure 15:
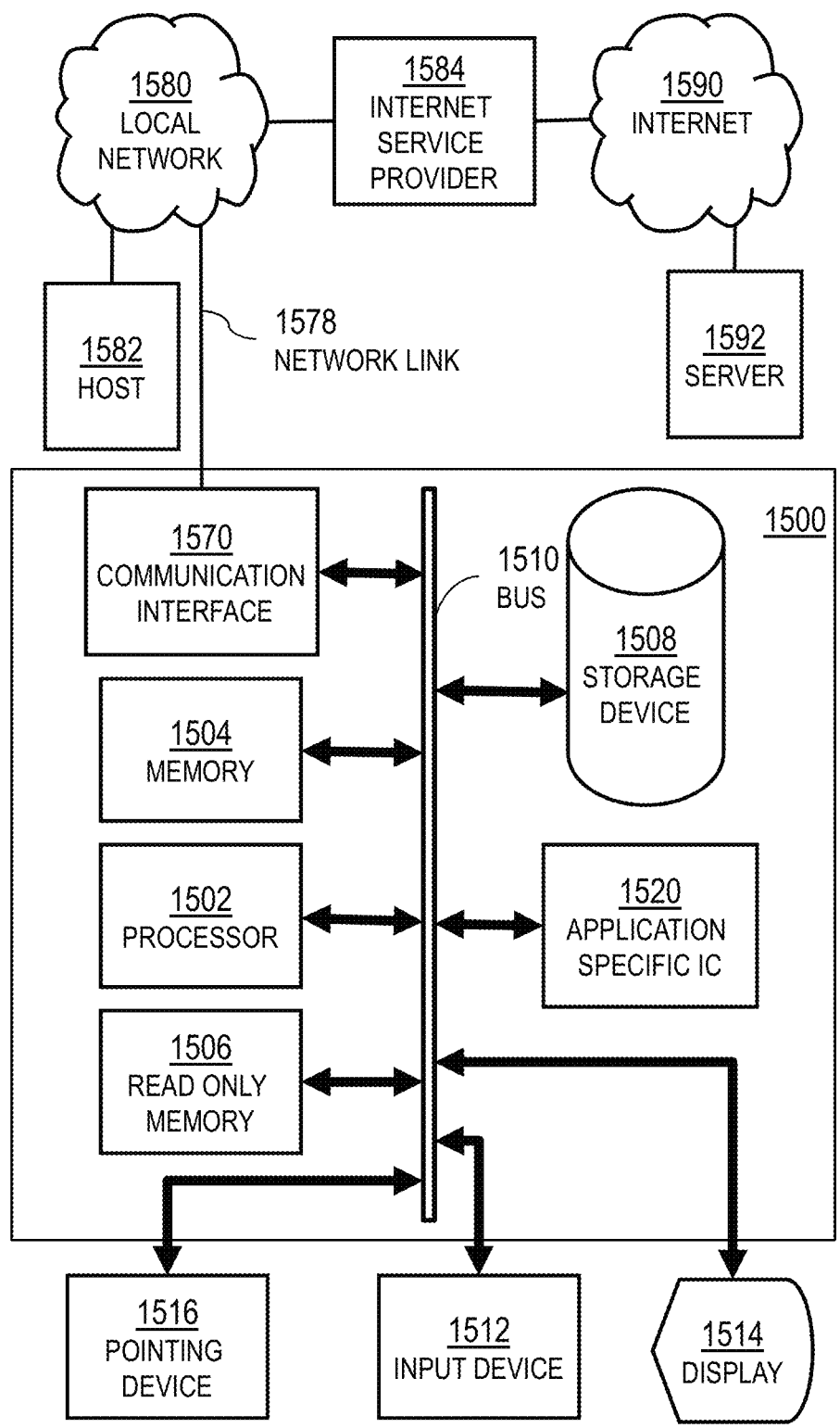
FIG. 15 is a block diagram that illustrates a computer system upon which an embodiment of the invention may be implemented.

Computer system 150, such as computer system 1500 described below with reference to FIG. 15, is configured to collect data from NMR system 120. According to an illustrated embodiment, a process 140 executing on computer system 150 calculates one or more characterizations of the mechanical properties of the target material 192 and, optionally, generates a stiffness intensity map with a resolution of one or more volume elements 122 throughout the target material 192. Although process 140 is depicted on the same computer system 150 that receives the data from imaging system 120 for purposes of illustration, in various other embodiments, process 140 executes on a different computer in communication with computer system 150, directly or indirectly via a communications or data network, as described below with reference to FIG. 15.

Figure 2:
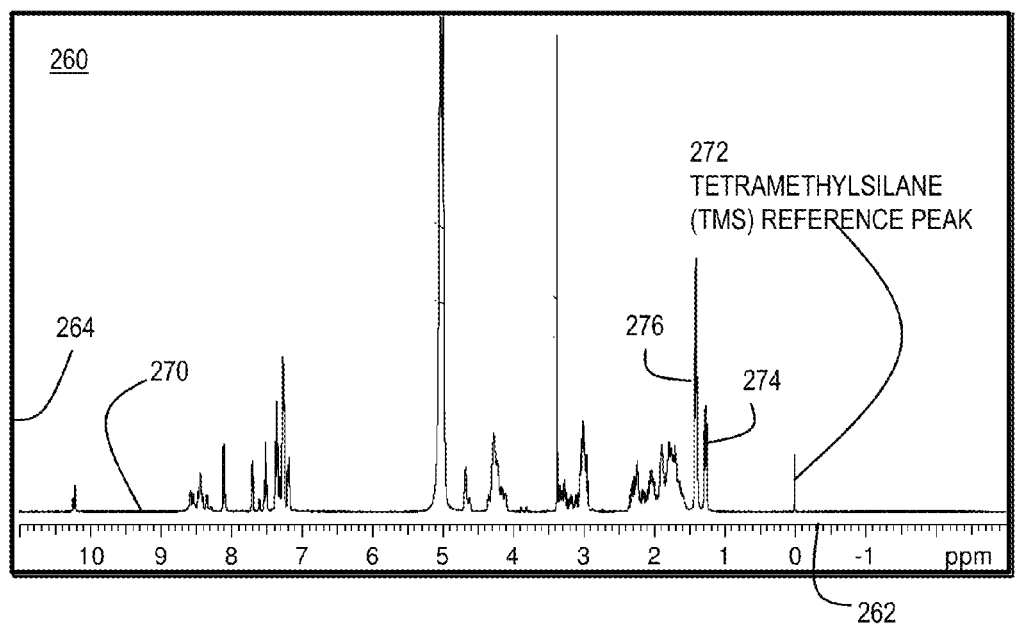
FIG. 2 is a graph that illustrates an example system NMR spectrum for a volume element in a hydrogel material, according to an embodiment.

FIG. 2 is a graph 260 that illustrates an example system NMR spectrum 270 for a MRSI volume element 222 in a hydrogel material, according to an embodiment. The horizontal axis 262 is frequency shift in parts per million (ppm) relative to the reference frequency of tertramethylsilane (TMS), a standard NMR reference, at peak 272 (0 ppm, by definition). The vertical axis 264 is relative amplitude in arbitrary units. Different peaks in spectrum 270 represent protons in nuclei of different chemical compounds, as is described in more detail below. The relaxation rates of some of these peaks are used to characterize the mechanical properties of the material, e.g., relaxation rates of peaks 272, 274 or 276 are used to characterize the mechanical properties of hydrogels in the illustrated embodiment. In some embodiments, the relaxation rate of the peak associated with hydrogen nuclei in water at about 5 ppm is used.

3. METHOD TO DETERMINE MECHANICAL CHARACTERISTICS

FIG. 3 is a flow diagram that illustrates at a high level an example method 300 for determining characterizations of the mechanical properties of a target material in a subject. In some embodiments, one or more steps of method 300 are performed by process 140, described above. Although steps in FIG. 3 are shown as integral blocks in a particular order for purposes of illustration, in other embodiments, one or more steps, or portions thereof, may be performed in a different order or overlapping in time, in series or in parallel, or one or more steps may be omitted or added, or changed in some combination of ways.

In step 301, calibration curves are determined that relate one or more relaxation rates to one or more mechanical properties. For example, a calibration curve relates the R2 relaxation rate to the elastic modulus of liver tissue or surrogates for liver tissue. In some embodiments, step 301 includes making dynamic rheological measurements of sample material in various states of disorder along with measurements of one or more relaxation rates of one or more molecular elements in the material, such as one or more mobile molecules, called diffusants, within the material. In various embodiments, diffusants include peptides, reference frequency standards, and water, among others. In some embodiments, the calibration curves are based on rheological measurements and relaxation rates of a common molecule, like water, in a surrogate material like hydrogels of various bulk material properties to represent a wide range of different viscoelastic materials, such as several different tissues in human organs. In such embodiments, the relaxation rates of the common diffusant, e.g., water, is assumed to depend predominately on the shear or elastic modulus of the material, regardless of the chemical makeup of the material. Thus, in some embodiments, separate calibration curves are not used for different tissues or organs of a human patient.

In some embodiments, the mechanical values are derived by interpolating between points on the calibration curves. In other embodiments, a simple functional form is fit to the data, such as a linear or polynomial function, or a log-linear function; and, mechanical values are derived from the function form.

In some embodiments, the calibration curves are predetermined and step 301 involves simply receiving data indicating the calibration curves (e.g., measured values, statistical summaries of the measured values, or functional forms). Any method may be used to receive the data indicating the calibration curves. For example, in various embodiments, the data is input manually by a user, is retrieved from storage either on a local device or over a communication network from a remote device, or is received in an unsolicited message or in a message received in response to a query message, or some combination.

In step 310, a subject is selected for NMR measurement. In various embodiments, the subject is an inanimate object, or a living being, or a biological specimen, such as a tissue sample, or some combination. Any subject that includes a hydrophilic target material of interest may be selected so long as it can fit within the NMR measurement device.

In step 320, a NMR measurement plan, such as an imaging plan, is developed. In some embodiments, among other factors, the imaging plan depends on the size, shape, and location of the target material 192 in the subject 190. In various embodiments, the target material 192 can have any volume that is small enough to fit within the NMR system measurement volume 124 and large enough to be resolved by the NMR system volume element 122. In certain embodiments, the target material will include the entire subject. In other embodiments, the target material will include only a portion of the subject, such as one anatomical unit. For example, an imaging plan may be created for a specific organ or localized area within a subject that is a human patient. In some embodiments, the duration of the imaging process of the imaging plan depends on the size of the target material. In some embodiments, the duration of imaging will last between about one minute and two hours. In other embodiments, the duration of imaging will last between about 30 minutes and one hour. One having ordinary skill in the art would be able to select an optimal scan duration for a particular subject and target material.

In step 330 the NMR measurement plan is carried out through the NMR system 120. NMR data is received by a computer in step 340. The data may be received during the measurement process 330 or all of the data may be uploaded to the computer at the conclusion of the measurement process 330.

In step 340, the relaxation rates of one or more mobile molecules (diffusants) in each volume resolved within the target material are determined. In some medical embodiments, the spin-lattice, R1, or spin-spin, R2, relaxation rates of nuclei, or both, in each volume 122 resolved in the target material 192 nuclei are collected in step 340.

In step 350 the desired mechanical characteristics of each volume in the target material are calculated using the methods described herein, without changing stress applied to the subject, e.g., with the subject in a rest posture. The mechanical characteristics of interest may include, for example, the shear modulus, elastic modulus, and viscous modulus, alone or in some combination. In some embodiments, step 350 includes using calibration curves for each target material.

In some embodiments, in step 360, a map of values for one or more of the elastic, shear or viscous moduli is generated and output for storage and subsequent display for a user or other analysis. In embodiment using MRI, a stiffness intensity map may optionally be generated in step 360, with each stiffness value based on some functional combination of the elastic, shear or viscous moduli at each volume element 122.

In step 370, the disorder state or change in disorder state is determined for the target material. For example, it is determined whether a portion of a liver has changed from a healthy state to a fibrosis diseased state, or a fibrosis diseased state has advanced or not, based on current values of one or more mechanical properties of the liver, or changes therein from previous measurements. Thus, in some embodiments the actual values of the mechanical characteristics are determined based on tissue specific calibration curves.

In other embodiments, relative mechanical characteristics are calculated compared to a baseline. For example, derivations of mechanical properties of healthy tissue of one or more subjects, or initial derivations of the same subject, determine a baseline value; and, subsequent derivations of mechanical properties are determined relative to that baseline value (e.g., an elastic modulus that is a particular percent more or less than the baseline value). In some instances, a first baseline range is associated with healthy tissue and one or more different ranges are associated with varying degrees of pathological tissue based on prior experiments. The ranges enable a clinician to diagnose a diseased state of one or more resolved volumes in the target organ. In embodiments that use relative values of mechanical properties, a generic calibration curve, such as water in hydrogels, is used in lieu of tissue specific calibration curves.

In step 380, the subject is treated based on the disorder state or change in disorder state determined during step 370. For example, the patient is treated for fibrosis of the liver determined by the increase in elastic modulus of volume elements in the liver tissue.

In step 390, it is determined if there is another NMR measurement to be taken of the subject, e.g., to determine a change in the target material mechanical properties. If so, control passes back to step 330 to measure the subject again. If not, the process ends.

2. EXAMPLE EMBODIMENTS

In one embodiment, a class of shear-responsive peptide hydrogels were formed to represent viscoelastic materials with wide variations in mechanical properties. In this work, NMR spectroscopy is used to monitor diffusants inside hydrogels and dynamic rheometry is used to characterize the viscoelasticity of hydrogels. A surprisingly simple linear relationship is determined between nuclear spin relaxation rates of peptide diffusants and shear modulus in peptide hydrogels. In another embodiment, a surprisingly simple log-linear relationship is determined between nuclear spin relaxation rates of water and shear modulus in peptide hydrogels over an exceptionally wide range of shear modulus values. Such relationships are used as calibration curves in various embodiments.

2.1 Peptide diffusants in hydrogels.

Hydrogels were prepared using two decapeptides, formyl-OF(OA)$_3$OW-amide (OAW10) and formyl-EF(EA)$_3$EW-amide (EAW10), which were synthesized on Rink-amide MBHA resin by solid-phase Fmoc-protocol (e.g., see Chan et al., 2000). The N-terminal of both peptides were formylated by 2,4,5-trichlorophenyl formate. The peptides are summarized in Table 2.

TABLE 2

Sequences and molecular weights (in Daltons) of a pair of oppositely charged decapeptides EAW10 and OAW10.

| peptides | sequences | M.W. (Da) | SEQ. ID. |
|---|---|---|---|
| EAW10 | formyl-EFEAEAEAEW-amide | 1,237.2 | SEQ. ID 1 |
| OAW10 | formyl-OFOAOAOAOW-amide | 1,162.3 | SEQ. ID 2 | where A indicates alanine; E indicates glutamic acid; F indicates phenylalanine; O indicates ornithine; and W indicates tryptophan. The N- and C-termini of each peptide were formylated (formyl-) and amidated (-amide), respectively.

Analytical grade reagents and solvents were purchased from SIGMA ALDRICH, INC.™, of St. Louis, Mo.; ALFA AESAR, INC.™, of Ward Hill, Mass.; AMRESCO, INC.™, of Solon, Ohio; and used without further purification. Rink amide MBHA resin for SPPS was purchased from CHEM-IMPEX, INC.™, of Wood Dale, Ill. Fmoc-protected amino acids were purchased from NOVABIOCHEM, INC™, of Billerica, Mass. Purifications of peptides were conducted on AGILENT™ (of Santa Clara, Calif.) 1100 HPLC system with a VWD detector. Column: AGILENTTMZORBAX 300SB-C18 PrepHT (21.2×250 mm, 7 micron particle size). Flow rate: 5 mL/min. Purity of peptides was verified on AGILENT™1100 HPLC with a DAD detector. Column: AGILENTTMZORBAX 300SB-C8 (4.6×250 mm, 5 micron particle size). Flow rate: 1 mL/min. Mass spectrometric analyses of the peptides were carried on FINNIGAN™ (of San Jose, Calif.) LCQ mass spectrometer.

The crude peptide were cleaved by a TFA/TIS/H$_2$O cocktail (trifluoroacetic acid, 95%; triisopropylsilane, 2.5%; water, 2.5%) for 3 hours and the side chain protect group were remove at the same time. Most TFA was removed by rotary evaporation, and then the crude peptides were precipitated and washed twice by cold ethyl ether. The precipitation were dissolved in water and lyophilized to give white crude peptide powder.

Figure 4A:
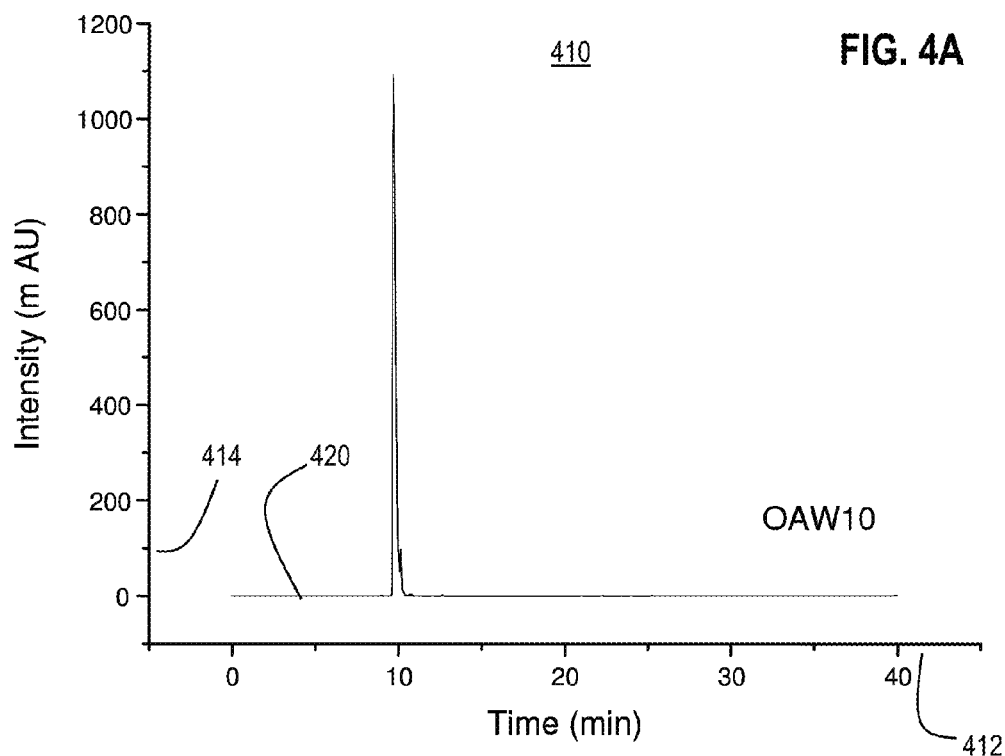
FIG. 4A and FIG. 4B are graphs that illustrate example reverse-phase High-performance liquid chromatography (HPLC) chromatograms of purified hydrogel components, according to an embodiment.
Figure 4B:
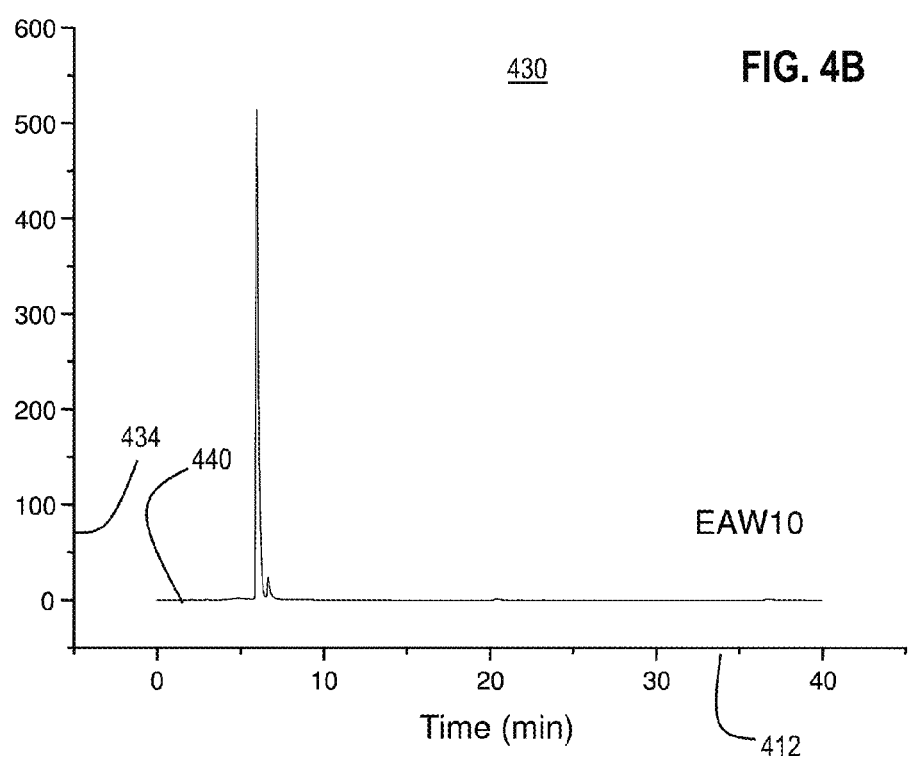

FIG. 4A and FIG. 4B are graphs 410, 430, respectively, that illustrate example reverse-phase High-performance liquid chromatography (HPLC) chromatograms of purified hydrogel components, according to an embodiment. In FIG. 4A, the horizontal axis 412 is time in minutes and the vertical axis 414 is intensity in arbitrary units. FIG. 4A depicts reverse-phase HPLC chromatogram of peptide OAW10 as trace 420. In FIG. 4B, the horizontal axis 412 is the same as in FIG. 4A; and the vertical axis 434 is intensity in arbitrary units at half the scale. FIG. 4B depicts reverse-phase HPLC chromatogram of peptide EAW10 as trace 440. Crude peptides were purified by preparative reverse-phase HPLC method. For purification of OAW10, solvent A is 0.1% TFA in water and solvent B is 0.1% TFA in acetonitrile; gradient elute, 0-40-100 B % in 0-60-90 minutes (min). For EAW10 purification, solvent A is 20 milliMolar (mM, 1 mM=10$^{-3}$ Molar) NH$_4$HCO$_3$ in water (pH=7.0), solvent B is 20 mM NH$_4$HCO$_3$ (pH 7.0) in acetonitrile/water (8:2); gradient elute, 0-40-100 B % in 0-60-90 min. The purity of OAW10 and EAW10 are shown in FIG. 4A and FIG. 4B by reverse-phase HPLC analysis. The solvents used are the same as the preparative HPLC method. Linear gradient (0-100 B % in 40 min) were used. These graphs demonstrate that significant separation and purification is achieved.

FIG. 5 is a graph 510 that illustrates example mass spectrometry peptide purity validation results as trace 520, according to an embodiment. The horizontal axis 512 indicates molecular weight in atomic mass units per number of elementary charges (unitless), and the vertical axis 514 indicates relative abundance in arbitrary units. Mass spectrometry provides a complementary method to HPLC for the analysis of peptides. Electrospray ionization mass spectrometry (ESI-MS) also gives good signals for the smaller peptides. FIG. 5 shows that the molecular weight of OAW10 is about 1162 daltons, as indicated by the dominant peak 522 in ESI-MS data, and that the sample is relatively pure.

Figure 6:
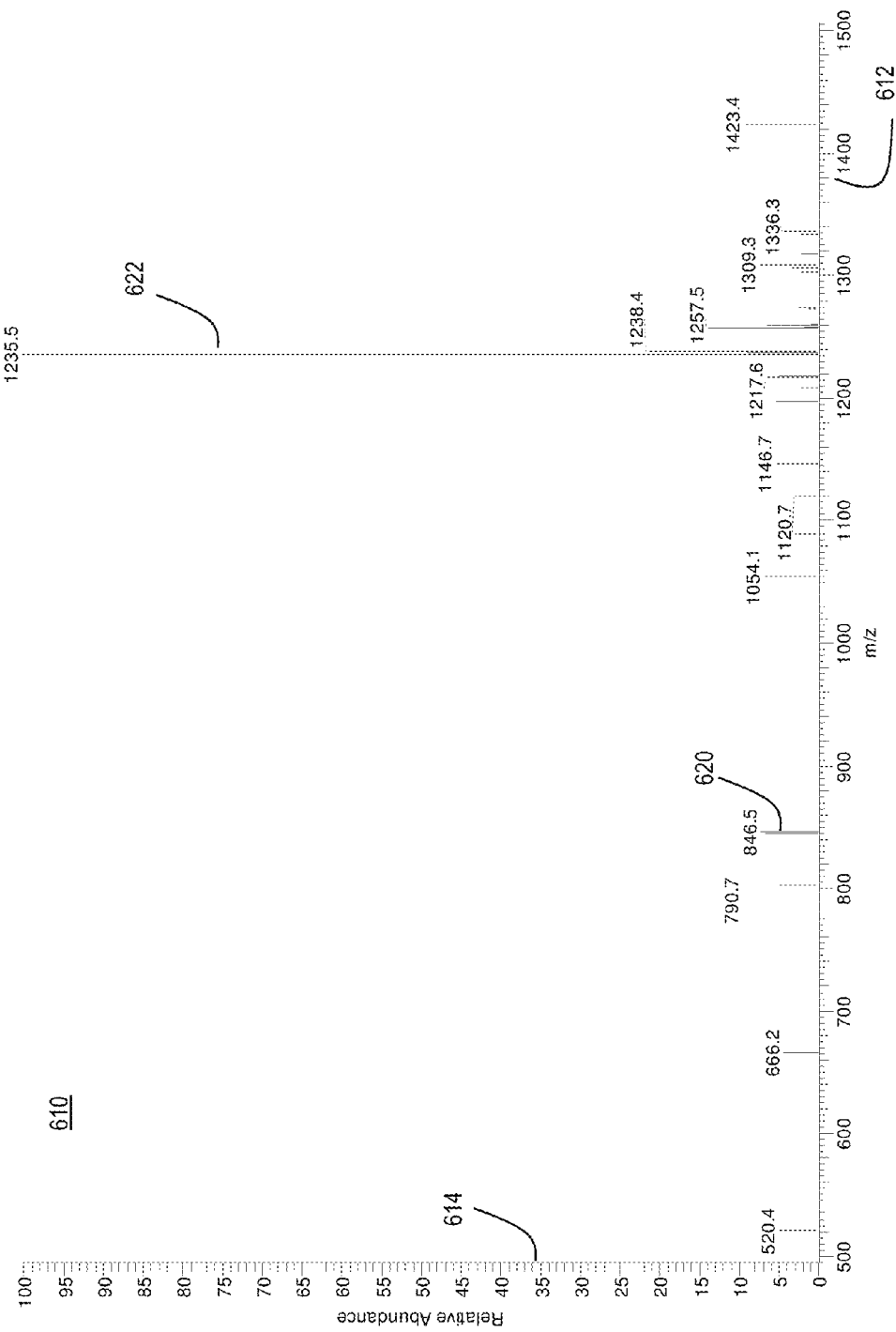
FIG. 6 is a graph that illustrates example mass spectrometry peptide purity validation results for a second peptide component of the hydrogel, according to an embodiment.

FIG. 6 is a graph 610 that illustrates example mass spectrometry peptide purity validation results for a second peptide component of the hydrogel as trace 620, according to an embodiment. This date was collected in an experiment carried out in negative charged mode. The horizontal axis 612 indicates molecular weight in atomic mass units per number of elementary charges (dimensionless), and the vertical axis 614 is relative abundance in arbitrary units. FIG. 6 shows that the molecular weight of EAW10 is about 1237 daltons, as indicated by the dominant peak 622 in this ESI-MS data, and that the sample is relatively pure.

Peptides were dissolved in PBS (50 mM $NaH_2PO_4$, 100 mMNaCl, pH 7.0) to form 10.0 mM stock solutions. The concentrations of the stock solutions were determined by ultraviolet (UV) absorption of the tryptophan residue in each peptide. The peptide stock solutions were pre-equilibrated prior to experiments either at room temperature (for 25° C. gelation) or in cold room (for 5° C. gelation). The NMR probe and rheometer geometry were pre-equilibrated at the corresponding temperature as well.

Equal volumes of the peptide stock solutions were mixed and transferred into a 5 mm NMR tube. All samples contained 10% $D_2O$ and about 17 μM TSP (trimethylsilyl-2,2,3,3-tetradeutero propionic acid) as a chemical shift reference (by definition plotted at 0.0 ppm in the $^1H$ spectra, e.g., peak 272 in FIG. 2).

All NMR experiments were carried on a VARIANINOVA 500™ spectrometer from VARIAN INC.™, Palo Alto, Calif. NMR data acquisition started about 10 min after mixing the two peptide solutions. Proton signal intensity, diffusion coefficient D, relaxation times $T_1$ and $T_2$, were measured in a sequential manner and repeated every hour, until no noticeable further decrease in $^1H$ signal intensity.

Pre-saturated water suppression was applied in all experiments. Diffusion coefficients were measured by the BPP-LED pulse sequence (e.g., see Wu et al., 1995). The inversion-recovery (e.g., see Vold et al., 1968) and CPMG (e.g., see Meiboom et al., 1958) pulse sequences were used to measure the spin-lattice and spin-spin relaxation times $T_1$ and $T_2$, respectively.

Figure 7A:
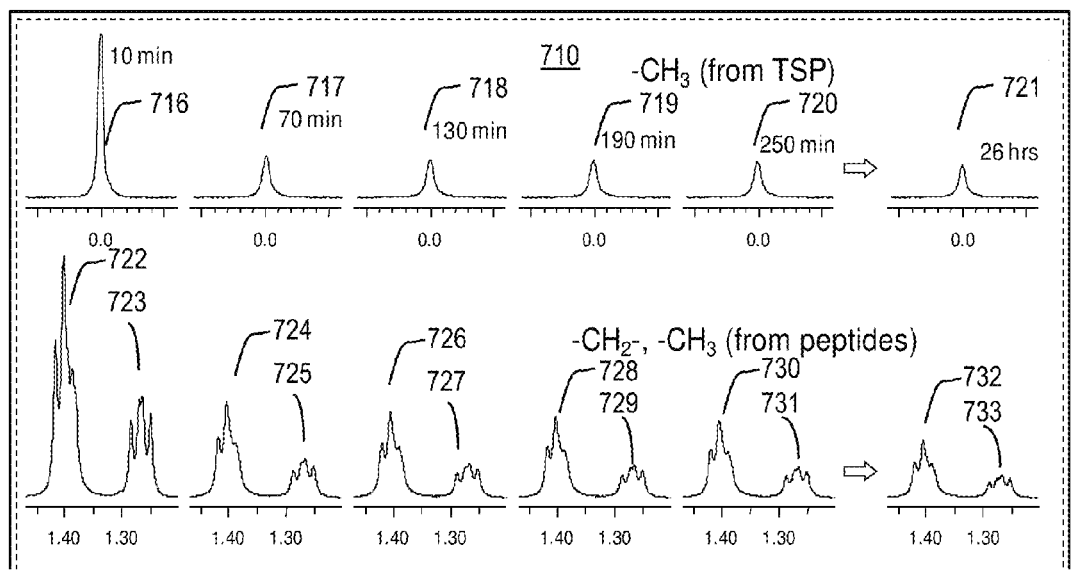
FIG. 7 is a chart that illustrates example dependence of the $^1$H NMR spectrum on gelation, and hence mechanical properties of a hydrogel, according to an embodiment.
Figure 7B:
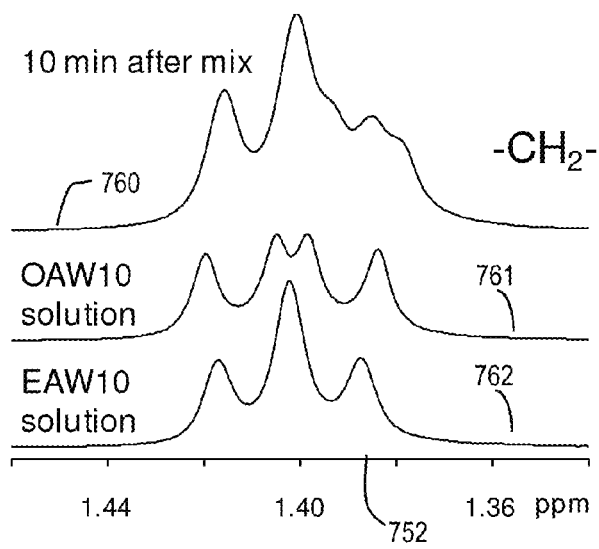
Figure 7C:
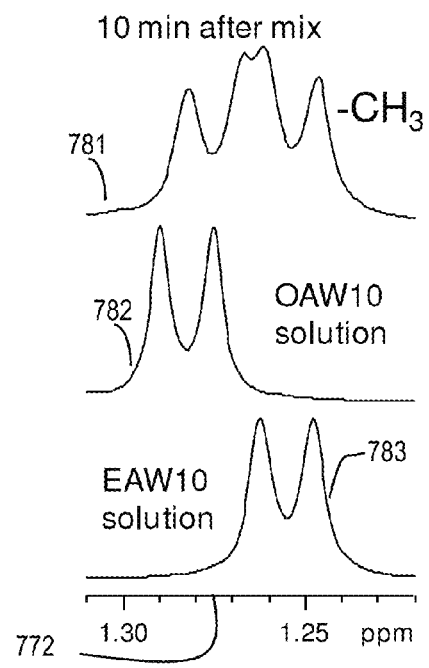

FIG. 7A, FIG. 7B and FIG. 7C are graphs that illustrates example dependence of the $^1H$ NMR spectrum on gelation, and hence mechanical properties of a hydrogel, according to an embodiment. FIGS. 7A, 7B and 7C show the NMR spectrum dependence of a hydrogel at 5° C.

FIG. 7A is a series of graphs that illustrate signal intensity decay during gelation. Relative peak height is plotted in 710 for three peaks in the spectrum corresponding to a hydrogen proton in a —$CH_3$ portion of the TSP reference (top, at 0.0 ppm, including peaks 716, 717, 718, 719, 720 and 721), a hydrogen proton in a —$CH_2$— portion (bottom left, at about 1.4 ppm, including even numbered peaks 722, 724, 726, 728, 730 and 732) and —CH3 portion (bottom right, at about 1.25 ppm, including odd numbered peaks 723, 725, 727, 729, 731 and 733) of the peptides making up the gel. These three sets of peaks correspond to the three peaks 272, 274 and 276, respectively in FIG. 2. TSP (3-(trimethylsilyl)-2,2',3,3'-tetradeuteropropionic sodium) is an NMR chemical shift standard added to each peptide solution. The initial NMR measurement is at 10 minutes after the mix, as gelation begins and many peptide molecules and TSP molecules are still mobile. The NMR measurements are repeated every hour for the next four hours (at 70 minutes, 130 minutes, 190 minutes and 250 minutes) and again at 26 hours. As gelation progresses, the amplitudes of all these peaks decrease, as fewer molecules are mobile and able to absorb at the resonant frequencies. Molecules cross-linked into the gel are not available for resonant absorption and are invisible to the NMR measurements.

FIG. 7B is a graph 750 that depicts the additive nature of the signals in the initial gel (ten minutes after mixture) for a hydrogen proton in a —$CH_2$— portion (at about 1.4 ppm) based on the constitutive signals of the two peptides that form the gel. The horizontal axis 752 is frequency shift in ppm; and, a vertical axis (not shown) is amplitude in arbitrary units. The EAW10 peptide has a —$CH_2$— portion signal shown by the bottom trace 762; the OAW10 peptide has a —$CH_2$— portion signal shown by the middle trace 761, and during initial gelation, the mobile peptides have a —$CH_2$— portion signal shown by the top trace 760 that is about equal to the sum of the two other traces, indicating relatively few of the peptides are cross-linked in the gel.

Similarly, FIG. 7C is a graph 770 that depicts the additive nature of the signals in the initial gel (ten minutes after mixture) for a hydrogen proton in a —$CH_3$ portion (at about 1.25 ppm) based on the constitutive signals of the two peptides that form the gel. The horizontal axis 772 is frequency shift in ppm; and, a vertical axis (not shown) is amplitude in arbitrary units. The EAW10 peptide has a —$CH_3$ portion signal shown by the bottom trace 783; the OAW10 peptide has a —$CH_3$ portion signal shown by the middle trace 782, and during initial gelation, the mobile peptides have a —$CH_3$ portion signal shown by the top trace 781 that is about equal to the sum of the two other traces, indicating relatively few of the peptides are cross-linked in the gel.

After the $^1H$ NMR signals reached plateau, a temperature switch experiment was conducted to form materials of very different mechanical properties. Such a range simulated mechanical property changes characterized by elastic modulus or shear modulus, or both, without a chemical change, such as may occur in a disordered material like a diseased tissue. A gel initially formed at 25° C. was cooled to 5° C. and kept at 5° C. for 4 hr for NMR measurements. A gel initially formed at 5° C. was heated to 25° C. and kept at 25° C. for additional NMR measurements until a new plateau was reached. This NMR experiment is described in more detail below with reference to FIG. 11.

Dynamic rheometry (DR) measurements were performed to determine which NMR signals, if any, were dependent on the mechanical properties of the gels. This or a similar step is often part of determining a calibration curve, as in step 301 of the method 300 described above. Dynamic rheological measurements were performed using a NOVA Rheometer (REOLOGICAINSTRUMENTS, INC.™, Lund, Sweden) with a sealed-cell geometry and a simple in-house built humidifier which prevents dehydration of the water-based samples during prolonged measurements.

Time-sweep measurements were conducted at 0.2% strain amplitude and 1 radian per second (rad/s) angular frequency. Frequency-sweep measurements were conducted at the respective temperatures with 0.2% strain amplitude, while the frequency was varied from 0.01 to 100 rad/s with 18 data points per frequency decade. FIG. 8A and FIG. 8B are graphs that illustrate example frequency-sweep dynamic rheometry measurements of the hydrogels, according to an embodiment. FIG. 8A is a graph 810 that shows the dynamic rheometry measurements for the gel formed at low temperature (5° C.), while FIG. 8B is a graph 850 that shows the dynamic rheometry measurements for the gel formed at room temperature (25° C.). The horizontal axis 812 in each graph indicates the angular frequency on a logarithmic scale that spans 4 orders of magnitude. The vertical axis 812 in each graph indicates the elastic modulus (G') or viscous modulus (G") value in pascals on a logarithmic scale that spans 5 orders of magnitude.

Graph 810 for the gel formed at low temperature shows the viscous modulus at the low temperature as frequency-sweep trace 820 and the viscous modulus when the gel is warmed to room temperature as frequency-sweep trace 821. The two traces differ by less than a factor of two, with greater difference at higher angular frequencies. Graph 810 shows the elastic modulus at the low temperature as frequency-sweep trace 830 and the elastic modulus when the gel is warmed to room temperature as frequency-sweep trace 831. The difference is about a factor of two with little change over the frequency range.

Similarly, graph 850 for the gel formed at room temperature shows the viscous modulus at room temperature as frequency-sweep trace 860 and the viscous modulus when the gel is cooled to 5° C. as frequency-sweep trace 861. Graph 860 shows the elastic modulus at room temperature as frequency-sweep trace 870 and the elastic modulus when the gel is cooled to 5° C. as frequency-sweep trace 871.

Figure 9A:
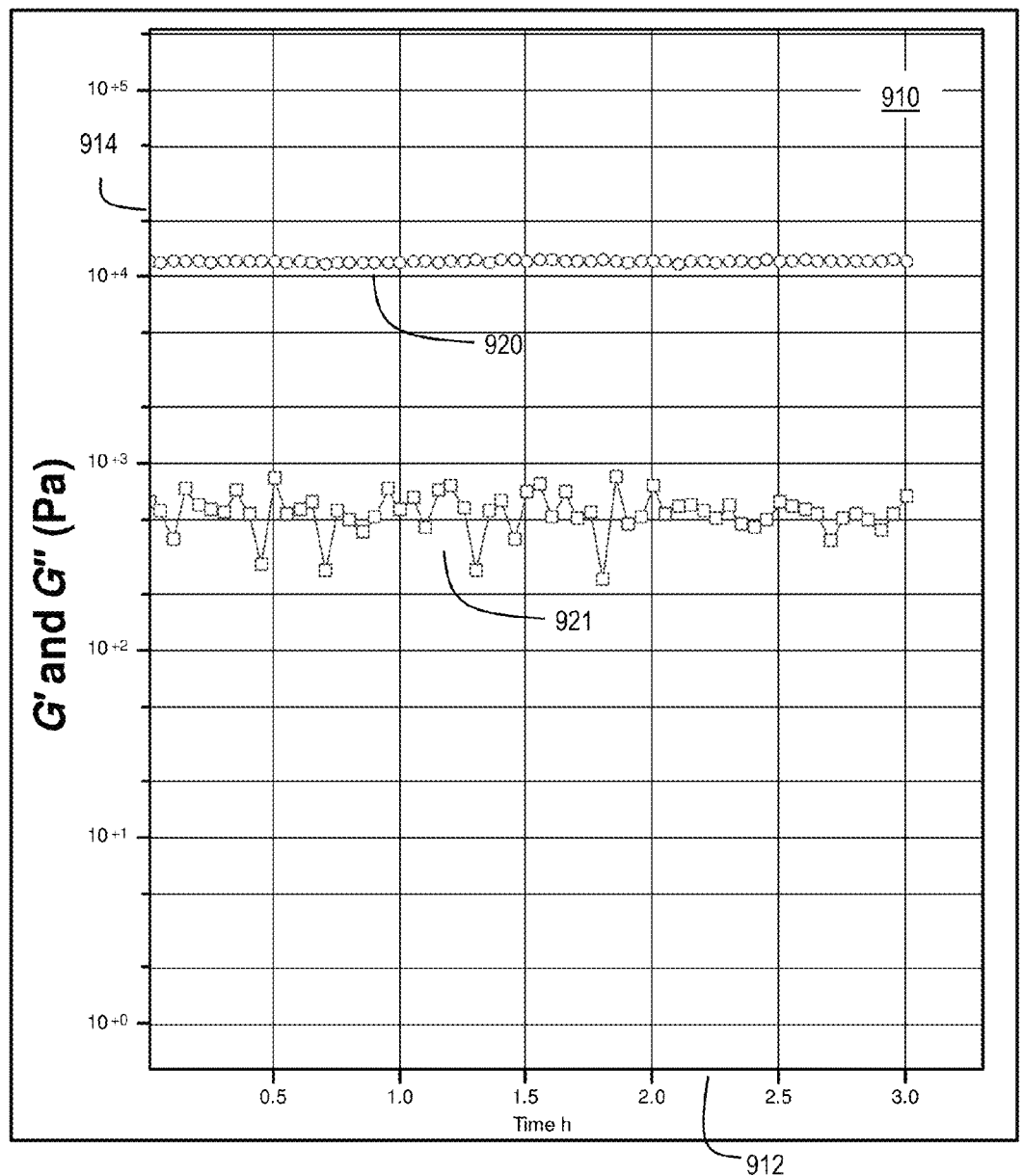

All gels demonstrate very similar G' and G" vs. angular frequency profiles. Such frequency profiles are characteristic for viscoelastic solid-like materials, with G" (ω) showing some signs of relaxation at higher frequencies around 100 rad/sec (especially for the gel formed at 5° C.). The G' has very slight dependence on the angular frequency within the studied range from 0.01 to 100 rad/sec, confirming the formation of stable solid-like hydrogel network with little or no mobility at time scales up to $t=2\pi/\omega \sim 600$ s, i.e., up to the longest measurement duration After the frequency-sweep measurements, a time-sweep of 3 hr was performed on the gel at 0.2% strain amplitude, 1 rad/s frequency to confirm that the gel remains undisturbed by the frequency-sweep. FIG. 9A and FIG. 9B are graphs 910 and 930, respectively, that illustrates example time-sweep measurements of viscoelastic properties of decapeptide hydrogels performed after frequency-sweeps confirming the stability of the gels, according to an embodiment. Each horizontal axis 912 and 932, respectively, indicates time in hours. Each vertical axis, 914 and 934, respectively, indicates the elastic modulus (G') or viscous modulus (G") value in pascals on a logarithmic scale that spans 5 orders of magnitude. The top time-sweep trace, 920 and 940, respectively, is elastic modulus and the bottom time-sweep trace, 921 and 941, respectively, is viscous modulus. FIG. 9A presents the measurements of the warmed gel formed at low temperature (5° C.→25° C. gel). FIG. 9B presents the measurements of the cooled gel formed at room temperature (25° C.→5° C. gel).

Figure 10A:
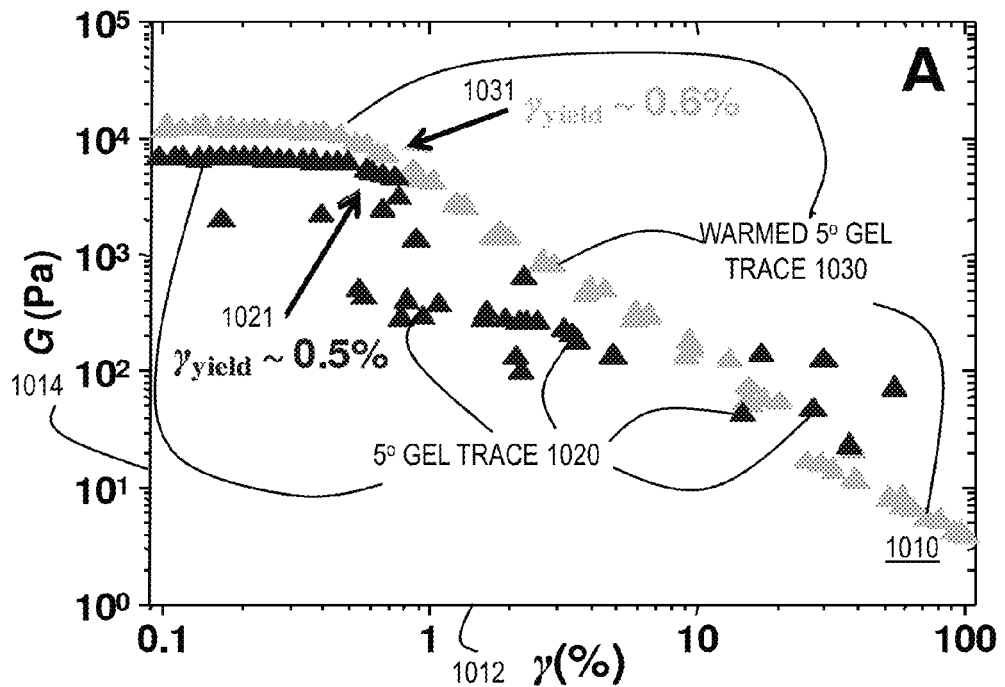
FIG. 10A and FIG. 10B are graphs that illustrate example strain-sweep measurements for hydrogels, according to an embodiment.
Figure 10B:
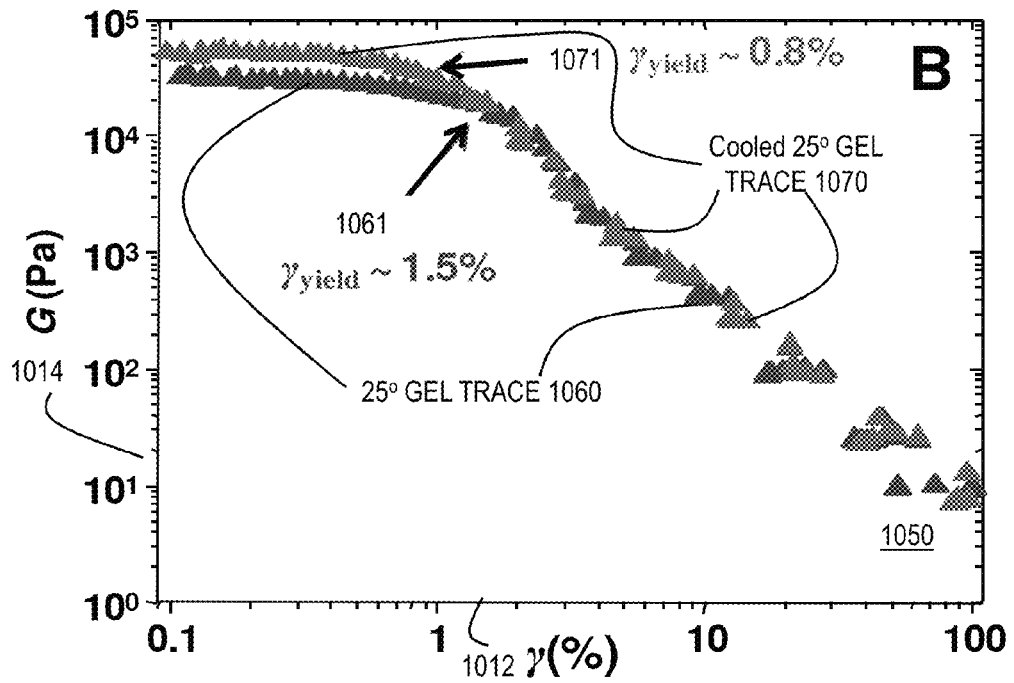

Strain-sweep measurements were then performed with a single integration cycle at 1 rad/s angular frequency, within the range of strain amplitudes from 0.1% to 100% with 23 data point per decade. FIG. 10A and FIG. 10B are graphs that illustrate example strain-sweep measurements for hydrogels, according to an embodiment. The horizontal axis 1012 indicates strain γ in percent on a logarithmic scale spanning three orders of magnitude; and the vertical axis 1014 indicates measured shear modulus G in pascals on a logarithmic scale spanning five orders of magnitude. Recall that shear modulus G depends on the elastic modulus G' and viscous modulus G" as given by Equation 4, above. FIG. 10A presents graph 1010 of the measurements of the gel formed at low temperature, both at low temperature (5° C.) as trace 1020 and warmed to room temperature (5° C.→25° C. gel) as trace 1030. FIG. 10B presents graph 1050 of the measurements of the gel formed at room temperature, both at room temperature (25° C.) as trace 1060 and cooled (25° C.→5° C. gel) as trace 1070. The yield point, $\gamma_{yield}$, for each trace, 1021, 1031, 1061, and 1071, respectively, is indicated by an arrow with a strain value in percent of 0.5%, 0.6%, 1.6% and 0.8%, respectively.

The gel formed at 25° C. is much stronger than the gel formed at 5° C. in terms of $\gamma_{yield}$ (1.5% vs. 0.5%). Warming the 5° C.→25° C. gel results in an insignificant increase in $\gamma_{yield}$ from 0.5% to 0.6%, while cooling down the 25° C.→5° C. gel makes the gel more brittle ($\gamma_{yield}$ drops from 1.5% to 0.8%) despite the fact that this gel has higher shear modulus.

Temperature switch measurements of dynamic rheometry were performed similar to the NMR studies described above. The gel formed at 25° C. was cooled down to 5° C., and the gel formed at 5° C. was heated up to 25° C. (linear temperature gradient was 0.4° C./min for both cooling and heating). The changes in the viscoelastic properties of the materials were monitored by time-sweep, frequency-sweep and strain-sweep experiments with the same parameter settings as above during the temperature switch.

Figure 11:
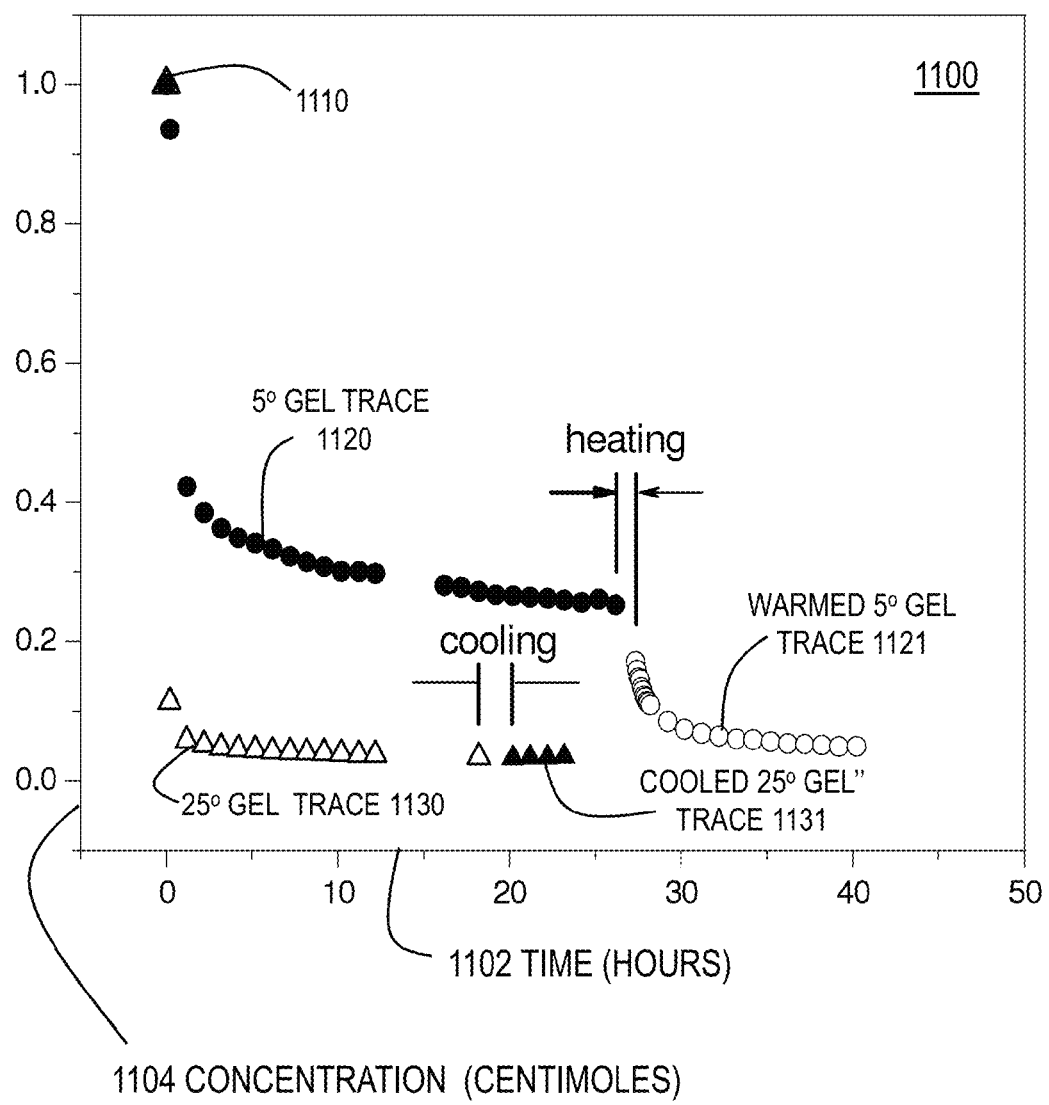
FIG. 11 is a graph that illustrates example concentration of mobile unincorporated peptide in a hydrogel as a function of time, according to an embodiment.

The hydrogen proton ($^1$H) signal centered at 1.27 ppm comes from the —CH$_3$ groups in both peptides, as shown in FIG. 7C, and is used to obtain gelation kinetic data. The peak intensity, I($^1$H), is proportional to the total concentration of mobile peptides. FIG. 11 is a graph 1100 that illustrates example concentration of mobile unincorporated peptide in a hydrogel as a function of time, according to an embodiment. The first data point 1110 represents the initial total peptide concentration of 10 milliMolar (mM, 1 mM=$10^3$ Molar,=10 centiMolar, cM, 1 cM=$10^{-2}$ Molar) at both 25° C. and 5° C. Points 1120 give concentration of mobile peptides in the 5° C. gel and points 1121 give concentration of mobile peptides in the warmed 5° C.→25° C. gel. Points 1130 give concentration of mobile peptides in the 25° C. gel and points 1131 give concentration of mobile peptides in the cooled 25° C.→5° C. gel. After varying adjustment times, each gel shows a plateau where the number of mobile peptides is stable over time.

In order to investigate the kinetics of gelation, a bimolecular reaction model is used to describe this process, as given by Equation 5.

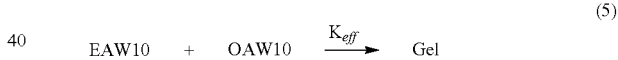

$$EAW10 \quad + \quad OAW10 \quad \xrightarrow{K_{eff}} \quad Gel \tag{5}$$

At t=0, the total peptide concentration is $C_0$ (=10 mM). At time t, the concentration of unincorporated mobile peptide is C(t) (the concentration of each unincorporated module is 0.5C(t) due to the 1:1 molar ratio of the two peptides). Assuming at large t, a portion of each peptide, the concentration of which is $0.5C_{mobile}$, remains unincorporated and hence still contributes to the NMR signal intensity. $C_{mobile}$ is a constant under a given gelation condition ($C_0 \geq C_{mobile} \geq 0$). Then the time rate of change of the concentration is given by Equation 6.

$$\frac{dC(t)}{dt} = -k_{eff}[0.5C(t) - 0.5C_{mobile}]^2 \tag{6}$$

The solution is given by Equation 7.

$$C(t) = \frac{C_0 - C_{mobile}}{1 + 0.25 k_{eff} \cdot (C_0 - C_{mobile}) \cdot t} + C_{mobile} \tag{7}$$

At large t, C(t)=$C_{mobile}$. The amount of peptides (in mM) that is eventually incorporated into the hydrogel matrix is $C_0 - C_{mobile}$. Fitting the experimental data in FIG. 11 to Equation 7, $k_{eff}$ and $C_{mobile}$ can be obtained for each gelation process and the results are listed in Table 3.

TABLE 3

Gelation kinetics parameters from a bimolecular reaction model.

| Samples | $k_{eff}$ (mM$^{-1}$·s$^{-1}$) | $C_{mobile}$ (mM) | $C_{immobile}$ (mM) | $R^2$ |
|---|---|---|---|---|
| 5° C. gel | 0.8 | 2.5 | 7.5 | 0.971 |
| 5° C. → 25° C. gel | — | 0.5 | 9.5 | — |
| 25° C. gel | 24.5 | 0.4 | 9.6 | 0.999 |
| 25° C. → 5° C. gel | — | 0.4 | 9.6 | — |

For the 5° C. gel and the 25° C. gel, fitting Equation 7 gives $k_{eff}$ and $C_{mobile}$. $R^2$ is the goodness of fit. For the 5° C.→25° C. gel and the 25°→5° C. gel, $C_{mobile}$ is the last C(t) value collected from each gel. $C_{immobile}=10$ mM$-C_{mobile}$ in all cases.

The results show that $k_{eff}$ at 25° C. is about 30 times as large as $k_{eff}$ at 5° C. At 25° C., about 4% (0.4 mM) of peptides remain mobile after 18 hours of gelation; at 5° C., ~about 25% (2.5 mM) of peptides remain mobile after 26 hours of gelation. Thus, at 25° C., gelation is not only faster, but also has more peptides incorporated into the hydrogel matrix.

When the 5° C. gel is heated to 25° C., more peptides are immobilized into the hydrogel matrix (~20%). In contrast, when the 25° C. gel is cooled to 5° C., no peptides are released from the hydrogel matrix (FIG. 11). This asymmetry between heating and cooling indicates these hydrogels are not equilibrium systems.

Diffusion coefficients of the peptides in solutions and in gels were measured by NMR spectroscopy using the $^1$H signals from —CH$_3$ and —CH$_2$— groups (Table 4). In all gels, unincorporated peptides in hydrogels have the same diffusion coefficients as peptides in solutions. The results suggest that unincorporated peptides in hydrogels do not form clusters and can diffuse freely.

TABLE 4

Diffusion coefficients D, relaxation times, $T_1$ and $T_2$, of peptides in solutions and in hydrogels

| Temperature | Sample | D ($10^{-10}$ m$^2$·s$^{-1}$) | $T_1$ (ms) | $T_2$ (ms) |
|---|---|---|---|---|
| 5° C. | EAW10 solution | 0.63 | 368.4 | 178.1 |
|  | OAW10 solution | 0.61 | 361.1 | 175.2 |
|  | 5° C. gel | 0.64 (0.02) | 242.8 (7.1) | 111.1 (3.1) |
|  | 25° C. → 5° C. gel | 0.66 (0.16) | 125.4 (3.3) | 29.8 (1.3) |
| 25° C. | EAW10 solution | 0.98 | 445.2 | 274.3 |
|  | OAW10 solution | 1.03 | 452.6 | 274.2 |
|  | 25° C. gel | 1.08 (0.13) | 148.2 (3.1) | 42.3 (3.2) |
|  | 5° C. → 25° C. gel | 1.28 (0.13) | 204.1 (5.1) | 91.4 (2.4) |

For hydrogels, the numbers represent the average value and standard deviation (in parentheses), which is based on 10 data points except for that for the 25° C.—5° C. gel, which is based on 4 data points. The D, $T_1$ and $T_2$ values were obtained from the $^1$H signal of the —CH$_3$ groups in peptides. Using the $^1$H signal from the —CH$_2$— groups in peptides, very similar D values are obtained: D(5° C. gel)=0.61±0.01; D(25° C.→5° C. gel)=0.62±0.12; D(25° C. gel)=1.07±0.12; D(5° C.→25° C. gel)=1.14±0.04, all in $10^{-10}$ m$^2$·s$^{-1}$. However, —CH$_2$— groups give $T_1$ and $T_2$ values different from —CH$_3$ groups, as shown below with reference to FIG. 13 As a result of gelation, these NMR spectra had a poor signal to noise ratio, which leads to a bigger standard deviation consequently.

The longitudinal and transverse relaxation times, $T_1$ and $T_2$, of the peptides were also measured by NMR spectroscopy (Table 4). Relaxation times satisfy the relationship of Equation 8 (i=1 or 2).

$$T_i(25° C. \text{ sol})>T_i(5° C. \text{ sol})>T_i(5° C. \text{ gel})>T_i(5° C.→25° C. \text{ gel})>T_i(25° C. \text{ gel})>T_i(25° C.→5° C. \text{ gel}) \quad (8)$$

In solutions, relaxation times increase with temperature because peptides move faster at 25° C., their correlation times shorten, and hence they have longer relaxation times, e.g., $T_i(25° C. \text{ sol})>T_i(5° C. \text{ sol})$. In hydrogels, the mobile peptides interact with the hydrogel matrix and their relaxation times were shortened, e.g., $T_i(\text{sol})>T_i(\text{gel})$ in all cases, regardless of temperature. Such shortening has no direct correlation with temperature and depends on gelation history. For example, $T_i(5° C. \text{ gel})>T_i(25° C.→5° C. \text{ gel})$ even though the two gels have the same temperature but different history. Similarly, $T_i(5° C.—25° C. \text{ gel})>T_i(25° C. \text{ gel})$. Thus, gelation-induced relaxation enhancement is not a temperature effect. In fact, $T_i(5° C. \text{ gel})>T_i(25° C. \text{ gel})$, the opposite from what one would expect from a pure temperature effect.

Gelation was also monitored by dynamic rheometry, which gives the elastic (G'), viscous (G") and shear (G) moduli of the hydrogels, as shown in FIG. 12. FIG. 12A and FIG. 12B are graphs 1210 and 1230, respectively, that illustrate example mechanical properties during the gelation process monitored by dynamic rheometry, according to an embodiment. The horizontal axis, 1212 and 1232, respectively, on each graph indicates time after mixture of the peptides, in hours. The vertical axis, 1214 and 1234, respectively, indicates the value of the elastic or viscous modulus in pascals on a logarithmic scale spanning five orders of magnitude. The upper traces (1221, 1222, 1241, 1242) in each graph are the elastic modulus, G'; the lower traces (1223, 1224, 1243, 1244) in each graph are the viscous modulus, G". In FIG. 12A, traces 1221 and 1223 before a heating event at about 21 hours represent gelation at 5° C. (5° C. gel); and traces 1222 and 1224 after the heating event represent a temperature switch to room temperature (5° C.→25° C. gel). In FIG. 12B, traces 1241 and 1243 before a cooling event at about 21 hours represent gelation at 25° C. (25° C. gel); and traces 1242 and 1244 after the cooling event represent a temperature switch to colder temperature (25° C.→5° C. gel).

These data characterize gels with similar chemical composition but elastic modulus changes of about 3 orders of magnitude, from about 30 pascals to about 50,000 pascals. Similarly, these data characterize gels with similar chemical composition but viscous modulus changes of almost 3 orders of magnitude, from about 5 pascals to about 3,000 pascals.

To explore the relationship between NMR relaxation rates (R1 and R2) and mechanical properties of the hydrogels, R1 and R2 of the diffusants (unincorporated peptides and TSP) were plotted vs. G', G" and G. A linear relationship was observed in all cases. As explained above, this linear relationship is not the result of temperature effect.

FIG. 13A through FIG. 13F are graphs that illustrate example dependence of NMR relaxation rates on mechanical properties of hydrogels, according to an embodiment. These graphs show NMR relaxation rates (R1 and R2) of three diffusant groups as functions of elastic (G'), viscous (G") or shear (G) moduli of hydrogels. Circles indicate —CH$_3$ of peptides; squares indicate —CH$_2$— of peptides; and triangles indicate —CH$_3$ of TSP. Four sets of modulus values are available for each diffusant group, each set corresponding to a different hydrogel, increasing in modulus value from the 5° C. gel; the 5° C.→25° C. gel; the 25° C. gel; and the 25° C.→5° C. gel. Solid symbols indicate longitudinal relaxation rates (R1, also called the spin-lattice relaxation rate); and, hollow symbols indicate transverse relaxation rates (R$^2$, also called the spin-spin relaxation rate). R1 and R2 values are taken from the plateau regions in FIG. 11 for each hydrogel category; while G', G" and G values are taken from the plateau regions in FIG. 12A or FIG. 12B. $R^2$ is the goodness of linear fit.

FIG. 13A depicts dependence of R1 on elastic modulus G'. The horizontal axis 1312 indicates elastic modulus in pascals spanning one order of magnitude (from 5 to 50 pascals); and, the vertical axis 1314 indicates R1 in inverse seconds. The lower trace 1318 indicates a very good linear fit through the data for —CH$_3$ of TSP with $R^2$=0.996. The middle trace 1317 indicates a very good linear fit through the data for —CH$_2$— of peptides with $R^2$=0.990. The top trace 1316 indicates a very good linear fit through the data for —CH$_3$— of peptides with $R^2$=0.996. Similarly, FIG. 13B depicts dependence of $R^2$ on elastic modulus G'. The horizontal axis 1322 is the same as in FIG. 13A; and, the vertical axis 1324 indicates $R^2$ in inverse seconds, spanning larger values that are about four times the values of R1. The lower trace 1328 indicts a very good linear fit through the data for —CH$_3$ of TSP with $R^2$=0.981. The middle trace 1327 indicates a very good linear fit through the data for —CH$_2$— of peptides with $R^2$=0.991. The top trace 1326 indicates a very good linear fit through the data for —CH$_3$— of peptides with $R^2$=0.994. Because the range of $R^2$ values is larger than the range of values for R1, R2 offers the advantage of a more sensitive indicator of elastic modulus G'.

FIG. 13C depicts dependence of R1 on viscous modulus G". The horizontal axis 1332 indicates viscous modulus in pascals spanning one order of magnitude (from 0.2 to 2 pascals); and, the vertical axis 1334 indicates R1 in inverse seconds. The lower trace 1338 indicates a very good linear fit through the data for —CH$_3$ of TSP with $R^2$=0.997. The middle trace 1337 indicates a very good linear fit through the data for —CH$_2$— of peptides with $R^2$=0.982. The top trace 1336 indicates a very good linear fit through the data for —CH$_3$— of peptides with $R^2$=0.998. Similarly, FIG. 13D depicts dependence of R2 on viscous modulus G". The horizontal axis 1342 is the same as in FIG. 13C; and, the vertical axis 1344 indicates R2 in inverse seconds. The lower trace 1348 indicts a very good linear fit through the data for —CH$_3$ of TSP with $R^2$=0.997. The middle trace 1347 indicates a very good linear fit through the data for —CH$_2$— of peptides with $R^2$=0.974. The top trace 1346 indicates a very good linear fit through the data for —CH$_3$— of peptides with $R^2$=0.972. Because the range of R2 values is larger than the range of values for R1, R2 offers the advantage of a more sensitive indicator of viscous modulus G".

FIG. 13E depicts dependence of R1 on shear modulus G. The horizontal axis 1352 indicates shear modulus in pascals spanning one order of magnitude (from 5 to 50 pascals); and, the vertical axis 1354 indicates R1 in inverse seconds. The lower trace 1358 indicates a very good linear fit through the data for —CH$_3$ of TSP with $R^2$=0.996. The middle trace 1357 indicates a very good linear fit through the data for —CH$_2$— of peptides with $R^2$=0.990. The top trace 1356 indicates a very good linear fit through the data for —CH$_3$— of peptides with $R^2$=0.996. Similarly, FIG. 13F depicts dependence of R2 on shear modulus G. The horizontal axis 1362 is the same as in FIG. 13E; and, the vertical axis 1364 indicates R2 in inverse seconds. The lower trace 1368 indicts a very good linear fit through the data for —CH$_3$ of TSP with $R^2$=0.981. The middle trace 1367 indicates a very good linear fit through the data for —CH$_2$— of peptides with $R^2$=0.991. The top trace 1366 indicates a very good linear fit through the data for —CH$_3$— of peptides with $R^2$=0.994. These fits are essentially identical to those of the elastic modulus and indicate the variations of elastic modulus dominate contributions to the shear modulus. Because the range of R2 values is larger than the range of values for R1, R2 offers the advantage of a more sensitive indicator of shear modulus G.

The relaxation enhancement caused by G (or G', G") is expressed by the linear relationship of Equation 9.

$$Ri = ai + bi \cdot G \qquad (9)$$

And parallels the paramagnetic relaxation enhancement caused by paramagnetic ions, given by Equation 10.

$$Ri = Ri0 + ri \cdot C \qquad (10)$$

where C is the concentration of paramagnetic ions. Hence, Equation 9 amounts to an "elastic relaxation enhancement". As $r_i$ is called the paramagnetic relaxivity (in $M^{-1} \cdot s^{-1}$), $b_i$ can be called the elastic relaxivity (in $Pa^{-1} \cdot s^{-1}$). Analogous to $r_2 > r_1$, $b_2 > b_1$ for all three proton groups as shown in FIG. 13A through FIG. 13F.

According to the classic BPP (Bloembergen-Purcell-Pound) theory of NMR relaxation in solutions (e.g., see Chan 2000), NMR relaxation rate R1 is linearly dependent on the correlation time $\tau_C$ of a molecule; and it has been shown by Hill that the rotational component of $\tau_T$ has a linear dependency on the viscosity of the solution (e.g., see Hill 1955). However, how this translates into a linear dependency of $R_i$ on G', G" and G in hydrogels remains to be clarified. It is anticipated that the slope of this linear dependency, $b_i$, reflects the strength of the interaction between the diffusants and the hydrogel matrix. This is supported by the observation that $b_i$ for the NMR standard TSP is much lower than $b_i$ for the peptides, which are components of the hydrogel matrix. The fact that —CH$_3$ and —CH$_2$— groups have different $b_i$ values suggests that different parts of the peptides interact differently with the hydrogel matrix.

The surprising significant, repeatable relationship points to the possibility of non-invasive and forceless mechanical characterizations of materials and tissues using NMR or MRI. The presented spin relaxivity-based mechanical characterization combines the advantages of magnetic resonance elastography and rheo-NMR, which are non-invasive, with the advantage of passive microrheology, which is forceless.

2.2 Water in Hydrogels.

Of particular interest is water relaxation in soft tissues for its diagnostic value and use in standard high resolution NMR imaging (MRI). Data have been collected to show that the spin-spin relaxation rate constant, R2, of water also increases with the elastic modulus, G', of hydrogels. In other words, water also displays elastic relaxation enhancement.

Hydrogels of extended elastic modulus range were generated that increase from near zero to over 110,000 Pa. This range doubles the range of the hydrogels of FIG. 13A and FIG. 13B, and covers the shear modulus ranges of diseased and normal tissues in the liver, breast, prostate, muscle, vocal fold, kidney, hypodermis, lung and brain listed in Table 1. These hydrogels demonstrate the improved mechanical properties because they are co-assembled from two oppositely charged undecapeptides carrying six charged amino acids each as opposed to five in the case of hydrogels of FIG. 13A and FIG. 13B. The amino acid sequences are given in Table 5.

TABLE 5

Figure 14A:
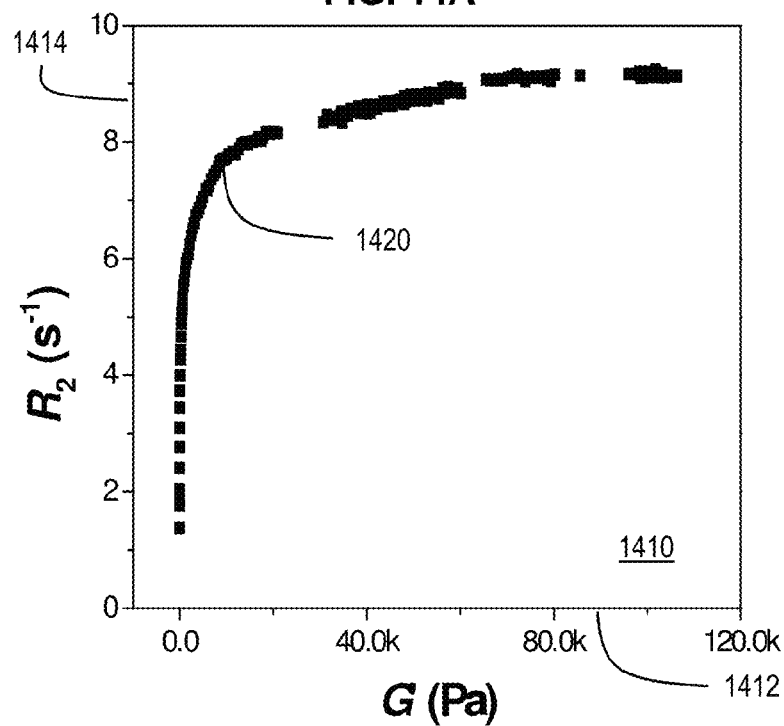
FIGS. 14A and 14B are graphs that illustrate example dependence of NMR relaxation rates of water on the mechanical properties of hydrogels, according to an embodiment.
Figure 14B:
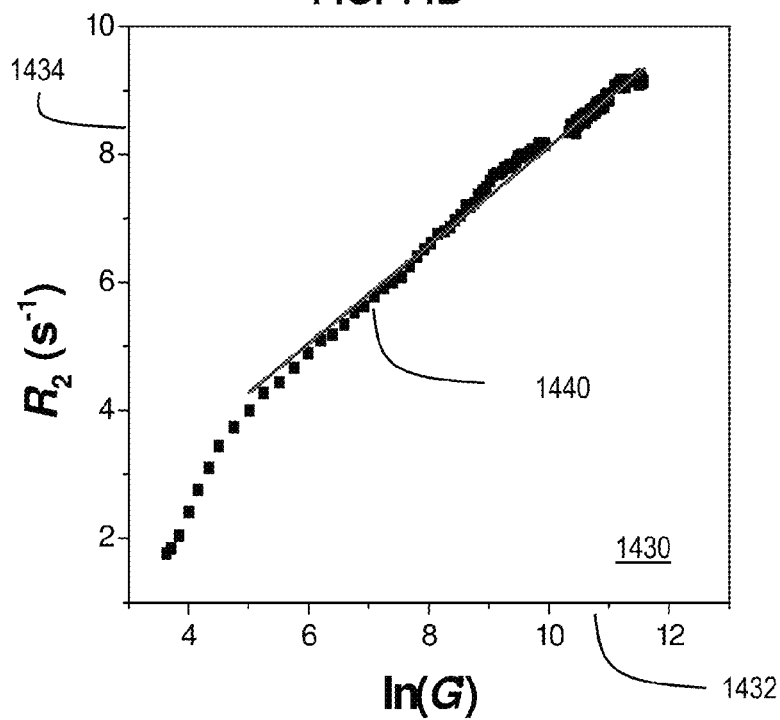

| Sequences of a pair of oppositely charged undecapeptides. | |
|---|---|
| sequences | SEQ ID |
| acetyl-KWKAKAKAKWK-amide | SEQ. ID 3 |
| acetyl-EWEAEAEAEWE-amide | SEQ. ID 4 | where A indicates alanine; E indicates glutamic acid; K indicates lysine; and W indicates tryptophan. The N- and C-termini of each peptide were acetylated (acetyl-) and amidated (-amide), respectively FIGS. 14A and 14B are graphs 1410 and 1430, respectively, that illustrate example dependence of NMR relaxation rates of water on the mechanical properties of hydrogels, according to an embodiment. In FIG. 14A, the horizontal axis 1412 indicates elastic modulus values in pascals; and, the vertical axis 1414 indicates R2 values in reciprocal seconds ($s^{-1}$). Trace 1420 shows dependence of R2 relaxation rate on elastic modulus G'. Unlike the linear fit of the peptide diffusants plotted in FIG. 13A and FIG. 13B, the dependency is decidedly non-linear. However, the data forms a well-defined curve with little scatter that promises a good fit to some function.

In FIG. 14B, the horizontal axis 1432 indicates the natural logarithm of the elastic modulus values in pascals; and, the vertical axis 1434 indicates R2 values in $s^{-1}$. Trace 1440 shows dependence of R2 relaxation rate on natural logarithm of the elastic modulus G'. It is noted that plotted in this fashion a highly linear range is evident from about ln(G')=5 (G'=148) and greater. Furthermore, the data show a well behaved relationship with little scatter down to the smallest values of the elastic modulus, where ln (G') is about 3.5 (G'=about 30 pascals).

Because magnetic resonance imaging (MRI) only measures water proton signal, this result is especially advantageous. It implies that the stiffness of biomaterials and soft tissues can be assessed non-invasively using MRI. In some embodiments, the log-linear relationship of FIG. 14B is used as a calibration curve to determine relative elastic modulus of a target material in a subject.

3. HARDWARE OVERVIEW

FIG. 15 is a block diagram that illustrates a computer system 1500 upon which an embodiment of the invention may be implemented. Computer system 1500 includes a communication mechanism such as a bus 1510 for passing information between other internal and external components of the computer system 1500. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit).). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 1500, or a portion thereof, constitutes a means for performing one or more steps of one or more methods described herein.

A sequence of binary digits constitutes digital data that is used to represent a number or code for a character. A bus 1510 includes many parallel conductors of information so that information is transferred quickly among devices coupled to the bus 1510. One or more processors 1502 for processing information are coupled with the bus 1510. A processor 1502 performs a set of operations on information. The set of operations include bringing information in from the bus 1510 and placing information on the bus 1510. The set of operations also typically include comparing two or more units of information, shifting positions of units of information, and combining two or more units of information, such as by addition or multiplication. A sequence of operations to be executed by the processor 1502 constitute computer instructions.

Computer system 1500 also includes a memory 1504 coupled to bus 1510. The memory 1504, such as a random access memory (RAM) or other dynamic storage device, stores information including computer instructions. Dynamic memory allows information stored therein to be changed by the computer system 1500. RAM allows a unit of information stored at a location called a memory address to be stored and retrieved independently of information at neighboring addresses. The memory 1504 is also used by the processor 1502 to store temporary values during execution of computer instructions. The computer system 1500 also includes a read only memory (ROM) 1506 or other static storage device coupled to the bus 1510 for storing static information, including instructions, that is not changed by the computer system 1500. Also coupled to bus 1510 is a non-volatile (persistent) storage device 1508, such as a magnetic disk or optical disk, for storing information, including instructions, that persists even when the computer system 1500 is turned off or otherwise loses power.

Information, including instructions, is provided to the bus 1510 for use by the processor from an external input device 1512, such as a keyboard containing alphanumeric keys operated by a human user, or a sensor. A sensor detects conditions in its vicinity and transforms those detections into signals compatible with the signals used to represent information in computer system 1500. Other external devices coupled to bus 1510, used primarily for interacting with humans, include a display device 1514, such as a cathode ray tube (CRT) or a liquid crystal display (LCD), for presenting images, and a pointing device 1516, such as a mouse or a trackball or cursor direction keys, for controlling a position of a small cursor image presented on the display 1514 and issuing commands associated with graphical elements presented on the display 1514.

In the illustrated embodiment, special purpose hardware, such as an application specific integrated circuit (IC) 1520, is coupled to bus 1510. The special purpose hardware is configured to perform operations not performed by processor 1502 quickly enough for special purposes. Examples of application specific ICs include graphics accelerator cards for generating images for display 1514, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 1500 also includes one or more instances of a communications interface 1570 coupled to bus 1510. Communication interface 1570 provides a two-way communication coupling to a variety of external devices that operate with their own processors, such as printers, scanners and external disks. In general the coupling is with a network link 1578 that is connected to a local network 1580 to which a variety of external devices with their own processors are connected. For example, communication interface 1570 may be a parallel port or a serial port or a universal serial bus (USB) port on a personal computer. In some embodiments, communications interface 1570 is an integrated services digital network (ISDN) card or a digital subscriber line (DSL) card or a telephone modem that provides an information communication connection to a corresponding type of telephone line. In some embodiments, a communication interface 1570 is a cable modem that converts signals on bus 1510 into signals for a communication connection over a coaxial cable or into optical signals for a communication connection over a fiber optic cable. As another example, communications interface 1570 may be a local area network (LAN) card to provide a data communication connection to a compatible LAN, such as Ethernet. Wireless links may also be implemented. Carrier waves, such as acoustic waves and electromagnetic waves, including radio, optical and infrared waves travel through space without wires or cables. Signals include man-made variations in amplitude, frequency, phase, polarization or other physical properties of carrier waves. For wireless links, the communications interface 1570 sends and receives electrical, acoustic or electromagnetic signals, including infrared and optical signals, that carry information streams, such as digital data.

The term computer-readable medium is used herein to refer to any medium that participates in providing information to processor 1502, including instructions for execution. Such a medium may take many forms, including, but not limited to, non-volatile media, volatile media and transmission media. Non-volatile media include, for example, optical or magnetic disks, such as storage device 1508. Volatile media include, for example, dynamic memory 1504. Transmission media include, for example, coaxial cables, copper wire, fiber optic cables, and waves that travel through space without wires or cables, such as acoustic waves and electromagnetic waves, including radio, optical and infrared waves. The term computer-readable storage medium is used herein to refer to any medium that participates in providing information to processor 1502, except for transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read. The term non-transitory computer-readable storage medium is used herein to refer to any medium that participates in providing information to processor 1502, except for carrier waves and other signals.

Logic encoded in one or more tangible media includes one or both of processor instructions on a computer-readable storage media and special purpose hardware, such as ASIC 1520.

Network link 1578 typically provides information communication through one or more networks to other devices that use or process the information. For example, network link 1578 may provide a connection through local network 1580 to a host computer 1582 or to equipment 1584 operated by an Internet Service Provider (ISP). ISP equipment 1584 in turn provides data communication services through the public, world-wide packet-switching communication network of networks now commonly referred to as the Internet 1590. A computer called a server 1592 connected to the Internet provides a service in response to information received over the Internet. For example, server 1592 provides information representing video data for presentation at display 1514.

The invention is related to the use of computer system 1500 for implementing the techniques described herein. According to one embodiment of the invention, those techniques are performed by computer system 1500 in response to processor 1502 executing one or more sequences of one or more instructions contained in memory 1504. Such instructions, also called software and program code, may be read into memory 1504 from another computer-readable medium such as storage device 1508. Execution of the sequences of instructions contained in memory 1504 causes processor 1502 to perform the method steps described herein. In alternative embodiments, hardware, such as application specific integrated circuit 1520, may be used in place of or in combination with software to implement the invention. Thus, embodiments of the invention are not limited to any specific combination of hardware and software.

The signals transmitted over network link 1578 and other networks through communications interface 1570, carry information to and from computer system 1500. Computer system 1500 can send and receive information, including program code, through the networks 1580, 1590 among others, through network link 1578 and communications interface 1570. In an example using the Internet 1590, a server 1592 transmits program code for a particular application, requested by a message sent from computer 1500, through Internet 1590, ISP equipment 1584, local network 1580 and communications interface 1570. The received code may be executed by processor 1502 as it is received, or may be stored in storage device 1508 or other non-volatile storage for later execution, or both. In this manner, computer system 1500 may obtain application program code in the form of a signal on a carrier wave.

Various forms of computer readable media may be involved in carrying one or more sequence of instructions or data or both to processor 1502 for execution. For example, instructions and data may initially be carried on a magnetic disk of a remote computer such as host 1582. The remote computer loads the instructions and data into its dynamic memory and sends the instructions and data over a telephone line using a modem. A modem local to the computer system 1500 receives the instructions and data on a telephone line and uses an infra-red transmitter to convert the instructions and data to a signal on an infra-red a carrier wave serving as the network link 1578. An infrared detector serving as communications interface 1570 receives the instructions and data carried in the infrared signal and places information representing the instructions and data onto bus 1510. Bus 1510 carries the information to memory 1504 from which processor 1502 retrieves and executes the instructions using some of the data sent with the instructions. The instructions and data received in memory 1504 may optionally be stored on storage device 1508, either before or after execution by the processor 1502.

Figure 16:
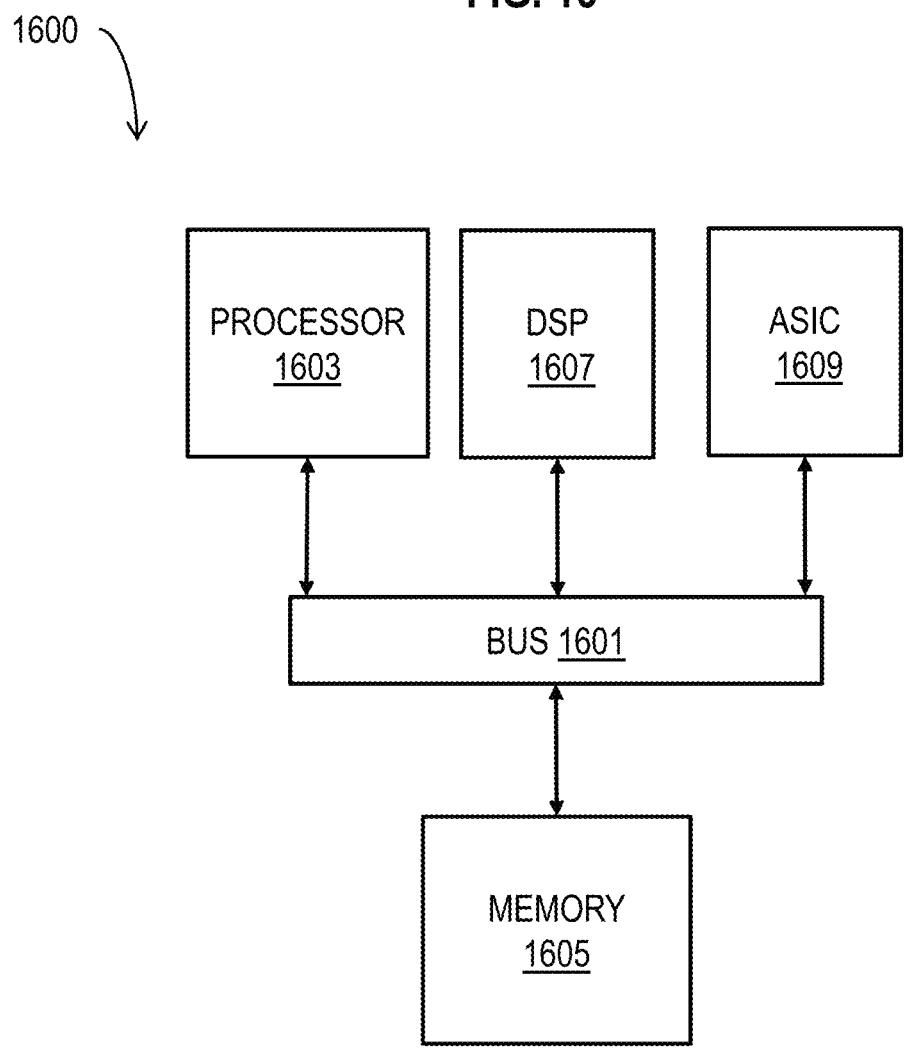
FIG. 16 illustrates a chip set upon which an embodiment of the invention may be implemented.

FIG. 16 illustrates a chip set 1600 upon which an embodiment of the invention may be implemented. Chip set 1600 is programmed to perform one or more steps of a method described herein and includes, for instance, the processor and memory components described with respect to FIG. *15 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 1600, or a portion thereof, constitutes a means for performing one or more steps of a method described herein.

In one embodiment, the chip set 1600 includes a communication mechanism such as a bus 1601 for passing information among the components of the chip set 1600. A processor 1603 has connectivity to the bus 1601 to execute instructions and process information stored in, for example, a memory

1605. The processor 1603 may include one or more processing cores with each core configured to perform independently. A multi-core processor enables multiprocessing within a single physical package. Examples of a multi-core processor include two, four, eight, or greater numbers of processing cores. Alternatively or in addition, the processor 1603 may include one or more microprocessors configured in tandem via the bus 1601 to enable independent execution of instructions, pipelining, and multithreading. The processor 1603 may also be accompanied with one or more specialized components to perform certain processing functions and tasks such as one or more digital signal processors (DSP) 1607, or one or more application-specific integrated circuits (ASIC) 1609. A DSP1607 typically is configured to process real-world signals (e.g., sound) in real time independently of the processor 1603. Similarly, an ASIC1609 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1603 and accompanying components have connectivity to the memory 1605 via the bus 1601. The memory 1605 includes both dynamic memory (e.g., RAM, magnetic disk, writable optical disk, etc.) and static memory (e.g., ROM, CD-ROM, etc.) for storing executable instructions that when executed perform one or more steps of a method described herein. The memory 1605 also stores the data associated with or generated by the execution of one or more steps of the methods described herein.

4. EXTENSIONS AND MODIFICATIONS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. Throughout this specification and the claims, unless the context requires otherwise, the word "comprise" and its variations, such as "comprises" and "comprising," will be understood to imply the inclusion of a stated item, element or step or group of items, elements or steps but not the exclusion of any other item, element or step or group of items. elements or steps. Furthermore, the indefinite article "a" or "an" is meant to indicate one or more of the item, element or step modified by the article.

5. REFERENCES

Cavanagh, J., W. J. Fairbrother, A. G. Palmer, N. J. Skelton, *Protein NMR Spectroscopy: Principles and Practice*, Academic Press, San Diego, 1996.

Chan, W. C. and P. D. White, *Fmoc Solid Phase Peptide Synthesis: A Practical Approach*, Oxford University Press: New York, 2000.

Hill, N. E., *Proc. Phys. Soc. B,* 68, 209, 1955.

Meiboom, S., and D. Gill, *Rev. Sci. Instrum.* 29, 688 (1958)

Morrison, F. A. *Understanding Rheology*, Oxford University Press, New York, 2001.

Vold, R. L., J. S. Waugh, M. P. Klein, D. E. Phelps, *J. Chem. Phys.* 48, 3831 (1968)

Wu, D. H., A. D. Chen, C. S. Johnson, *J. Magn. Reson. A* 115, 260, 1995.

---

What is claimed is:

1. A method of MRI comprising:

retrieving from a digital storage device a calibration curve that relates a plurality of nuclear magnetic resonance relaxation rates of a mobile molecule that is capable of moving through a first material to a corresponding plurality of values of the mechanical property in a corresponding plurality of states of one or more second materials containing the mobile molecule measuring, using a nuclear magnetic resonance device, non-invasively and only without applying deformational stress, a nuclear magnetic resonance relaxation rate of the mobile molecule at a volume inside a subject;

determining on a processor a first value with respect to a mechanical property of a first material at the volume inside the subject based on the measured nuclear magnetic resonance relaxation rate of the mobile molecule and the calibration curve, wherein the mechanical property is one or more of an elastic modulus or a viscous modulus or a shear modulus; and presenting on a display device connected to the processor an output data based on the first value of the mechanical property.

2. A method of MRI as recited in claim 1, wherein the method of MRI further comprises determining the calibration curve by measuring, using a nuclear magnetic resonance device, non-invasively and only without applying deformational stress, the relaxation rate of the mobile molecule in each of the plurality of states of the one or more second materials containing the mobile molecule.

3. A method of MRI as recited in claim 1, wherein the one or more second materials has similar mechanical properties to corresponding mechanical properties of the first material.

4. A method of MRI as recited in claim 1, wherein the subject is a living being, and the first material is a tissue.

5. A method of MRI as recited in claim 1, wherein the nuclear magnetic resonance relaxation rate is a transverse nuclear magnetic resonance relaxation rate designated R2.

6. A method of MRI as recited in claim 1, wherein the mechanical property of the first material is an elastic modulus and the nuclear magnetic resonance relaxation rate is a transverse nuclear magnetic resonance relaxation rate designated R2.

7. A method of MRI as recited in claim 1, wherein presenting on the display the result further comprises generating as the output a stiffness intensity map based on the mechanical property of the first material being stiffness at a plurality of volumes inside the subject.

8. A method of MRI as recited in claim 1, further comprising determining a disorder state in the subject based on a change in the first value with respect to the mechanical property of the first material at the volume inside the subject from a second value with respect to the same mechanical property of the first material at the volume inside the subject at a previous time.

9. A method of MRI as recited in claim 8, further comprising treating the subject based on the determined disorder state within the subject.

10. A method of MRI as recited in claim 1, wherein the volume is a nuclear magnetic resonance imaging volume element or a NMR imaging voxel.

11. A method of MRI as recited in claim 1, wherein the volume is a nuclear magnetic resonance spectroscopic imaging volume element or a NMR spectroscopic imaging voxel.

12. A method of MRI as recited in claim 1, wherein the first value with respect to the mechanical property, is an elastic modulus in a range from about 30 pascals to about 110,000 pascals, when the mechanical property is elasticity.

13. A non-transitory computer-readable medium carrying one or more sequences of instructions, wherein execution of the one or more sequences of instructions by one or more processors causes an NMR compatible apparatus to:
    retrieve from a digital storage device a calibration curve that relates a plurality of nuclear magnetic resonance relaxation rates of a mobile molecule that is capable of moving through a first material to a corresponding plurality of values of the mechanical property in a corresponding plurality of states of one or more second materials containing the mobile molecule
    obtain measurements of a nuclear magnetic resonance relaxation rate of a mobile molecule at a volume inside a subject, from a nuclear magnetic resonance device, non-invasively and only without applying deformational stress,
    determine a nuclear magnetic resonance relaxation rate of a mobile molecule at a volume inside a subject, based on the obtained measurements, from the nuclear magnetic resonance device;
    determine with a processor a mechanical property of a first material at the volume inside the subject, based on the determined nuclear magnetic resonance relaxation rate of the mobile molecule, and the retrieved calibration curve,
    wherein the mechanical property is one or more of an elastic modulus or a viscous modulus or a shear modulus; and
    present on a display device connected to the processor an output data based on the first value of the mechanical property.

14. A non-transitory computer-readable medium as recited in claim 13, wherein the mechanical property is an elastic modulus and the nuclear magnetic resonance relaxation rate is a transverse nuclear magnetic resonance relaxation rate designated R2.

15. A non-transitory computer-readable medium as recited in claim 13, wherein, the at least one processor generates and then presents on the display, and output of a stiffness intensity map based on the mechanical property of the tissue at a plurality of volumes inside the subject.

16. A non-transitory computer-readable medium as recited in claim 13, wherein the NMR compatible apparatus is further configured to determine with the at least one processor a disorder state in the subject based on a change in the first value, with respect to the mechanical property of the first material at the volume inside the subject, from a second value with respect to the same mechanical property of the first material at the volume inside the subject at a previous time.

17. A NMR system comprising:
    a nuclear magnetic resonance device;
    a display device;
    at least one processor; and
    at least one memory including one or more sequences of instructions, wherein the at least one memory and the one or more sequences of instructions is configured to, with the at least one processor, in order to cause the NMR system to perform at least the following,
    retrieve from the at least one memory a calibration curve that relates a plurality of nuclear magnetic resonance relaxation rates of a mobile molecule, that is capable of moving through a first material, to a corresponding plurality of values of a mechanical property in a corresponding plurality of states, of one or more second materials containing the mobile molecule
    obtain measurements from the nuclear magnetic resonance device, non-invasively and only without applying deformational stress, a nuclear magnetic resonance relaxation rate of a mobile molecule at a volume inside a subject;
    determine with the nuclear magnetic resonance device, a nuclear magnetic resonance relaxation rate of the mobile molecule, at a volume inside a subject based on the obtained measurements from the nuclear magnetic resonance device;
    determine with the at least one processor a mechanical property of a first material at the volume inside the subject based on the determined nuclear magnetic resonance relaxation rate of the mobile molecule and the calibration curve, wherein the mechanical property is one or more of an elastic modulus or a viscous modulus or a shear modulus; and
    present on the display device connected to the processor an output data based on the first value of the mechanical property.

18. A NMR system as recited in claim 17, wherein the mechanical property is an elastic modulus and the nuclear magnetic resonance relaxation rate is a transverse nuclear magnetic resonance relaxation rate designated R2.

19. A NMR system as recited in claim 17, wherein, the at least one processor generates and then presents on the display, and output of a stiffness intensity map based on the mechanical property of the tissue at a plurality of volumes inside the subject.

20. A NMR system as recited in claim 17, wherein the NMR system is further configured to determine with the at least one processor a disorder state in the subject based on a change in the first value, with respect to the mechanical property of the first material at the volume inside the subject, from a second value, with respect to the same mechanical property of the first material at the volume inside the subject at a previous time.

\* \* \* \* \*